United States Patent
Anzawa et al.

(10) Patent No.: US 8,237,044 B2
(45) Date of Patent: Aug. 7, 2012

(54) CONCENTRATING SOLAR POWER GENERATION UNIT, CONCENTRATING SOLAR POWER GENERATION APPARATUS, CONCETRATING LENS, CONCENTRATING LENS STRUCTURE, AND METHOD OF MANUFACTURING CONCENTRATING LENS STRUCTURE

(75) Inventors: Osamu Anzawa, Nara (JP); Kosuke Ueda, Nara (JP); Masao Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 694 days.

(21) Appl. No.: 11/921,465

(22) PCT Filed: Jun. 7, 2006

(86) PCT No.: PCT/JP2006/311403
§ 371 (c)(1),
(2), (4) Date: Dec. 3, 2007

(87) PCT Pub. No.: WO2006/132265
PCT Pub. Date: Dec. 14, 2006

(65) Prior Publication Data
US 2009/0133737 A1    May 28, 2009

(30) Foreign Application Priority Data

Jun. 7, 2005  (JP) ................................. 2005-167526
Jun. 7, 2005  (JP) ................................. 2005-167527

(51) Int. Cl.
*H01L 31/042*    (2006.01)

(52) U.S. Cl. .................................................. 136/246
(58) Field of Classification Search .................. None
See application file for complete search history.

(56) References Cited

U.S. PATENT DOCUMENTS

| | | | | |
|---|---|---|---|---|
| 4,511,755 A | * | 4/1985 | Mori ............................. | 136/246 |
| 5,096,505 A | * | 3/1992 | Fraas et al. ..................... | 136/246 |
| 6,399,874 B1 | * | 6/2002 | Olah ............................. | 136/259 |
| 6,653,551 B2 | * | 11/2003 | Chen ............................. | 136/246 |
| 2005/0046977 A1 | * | 3/2005 | Shifman ...................... | 359/853 |

FOREIGN PATENT DOCUMENTS

JP    57-2582    1/1982
(Continued)

OTHER PUBLICATIONS

International Search Report for PCT/JP2006/311403 mailed Aug. 22, 2006.

*Primary Examiner* — Jessica L Ward
*Assistant Examiner* — Steven Ha
(74) *Attorney, Agent, or Firm* — Nixon & Vanderhye, P.C.

(57) ABSTRACT

A concentrating solar power generation unit (10) comprises a solar cell element (1), a mounting plate (3) on which is mounted the solar cell element (1), which is bonded to a receiver (2), a light shield (4) that covers the mounting plate (3), a frame (5) disposed perpendicularly from the ends on two facing sides of a light shield (4), a concentrating lens (7) that is disposed corresponding to the upper end of the frame (5) across from the light shield (4) and that concentrates sunlight (Ls) on a light receiving region of the solar cell element (1), and a translucent substrate (6) that fixes (fastens) the concentrating lens (7) and is mounted to the upper end of the frame (5).

8 Claims, 17 Drawing Sheets

FOREIGN PATENT DOCUMENTS

| | | |
|---|---|---|
| JP | 59-161460 | 10/1984 |
| JP | 10-107301 | 4/1998 |
| JP | 11-284217 | 10/1999 |
| JP | 2000-68540 | 3/2000 |
| JP | 2000-268749 | 9/2000 |
| JP | 2002-134641 | 5/2002 |
| JP | 2002-535699 | 10/2002 |
| JP | 2003-174183 | 6/2003 |
| JP | 2003-266450 | 9/2003 |
| JP | 2003-344740 | 12/2003 |
| JP | 2004-214491 | 7/2004 |
| JP | 2004-241495 | 8/2004 |
| WO | 00/42469 | 7/2000 |

\* cited by examiner (A)

CONCENTRATING SOLAR POWER GENERATION UNIT, CONCENTRATING SOLAR POWER GENERATION APPARATUS, CONCETRATING LENS, CONCENTRATING LENS STRUCTURE, AND METHOD OF MANUFACTURING CONCENTRATING LENS STRUCTURE

This application is the U.S. national phase of International Application No. PCT/JP2006/311403 filed 7 Jun. 2006 which designated the U.S. and claims priority to Japanese Patent Application Nos. 2005-167526 filed 7 Jun. 2005 and 2005-167527 filed 7 Jun. 2005, the entire contents of each of which are hereby incorporated by reference.

TECHNICAL FIELD

The technology disclosed herein relates to a concentrating solar power generation unit with which power generation capacity can be increased by using a concentrating lens to concentrate sunlight, to a concentrating solar power generation apparatus equipped with such a concentrating solar power generation unit, to a concentrating lens, to a concentrating lens structure, to a concentrating solar power generation unit that makes use of a concentrating lens, and to a method for manufacturing a concentrating lens structure.

BACKGROUND ART

There have been practical applications of solar power generation apparatus for converting solar energy into electrical power, but to lower costs and obtain more power, there have been practical applications of concentrating solar power generation apparatus, a type with which sunlight concentrated by a concentrating lens irradiates a solar cell element with a smaller surface area than the light receiving area of the concentrating lens, and electrical power is taken off.

With a concentrating solar power generation apparatus, sunlight is concentrated with a concentrating lens, so the solar cell element may have a smaller light receiving surface area that can receive sunlight that has been concentrated with an optical system. In other words, since a solar cell element may be used that is smaller in size than the light receiving surface area of the concentrating lens, the solar cell element can be made more compact, which means that the amount of solar cell elements, which are the most costly element in a solar power generation apparatus, can be reduced, and costs can be lowered. Because of these advantages, concentrating solar power generation apparatus are being utilized for power supply in locales where power can be generated using a large surface area, for example.

A concentrating solar power generation apparatus has been proposed which has a simple structure in which a solar cell module is attached to a support frame, with adequate strength and stiffness being obtained without having to increase weight, so good heat dissipation can be achieved—(see, for example, Patent Document 1).

Meanwhile, FIG. 17 is a diagram illustrating a conventional example of a concentrating solar power generation apparatus. FIG. 17(A) is a plan view giving a general overview as seen from the plane of sunlight incidence, and FIG. 17(B) is a cross-sectional view of the cross section along the B-B line in FIG. 17(A).

A concentrating solar power generation apparatus 100 in this conventional example (see, for example, Patent Document 2) comprises a case 101 that is open at one end face, non-imaging Fresnel lenses 102 fitted into the opening in the case 101 so as to function as a primary optical system, a seat plate 103 provided to the bottom of the case 101, solar cell elements 104 disposed on the bottom face of the case 101, that is, over the seat plate 103, which is the concentrating position of the non-imaging Fresnel lenses 102, and tubular reflecting mirrors 105 that function as a secondary optical system.

Patent Document 1: JP H11-284217A
Patent Document 2: JP 2003-174183A

However, the concentrating lens of a concentrating solar power generation apparatus has to be disposed in a precise positional relationship to the solar cell element, so good alignment is necessary. Furthermore, concentration at the light receiving position entails a tremendous amount of energy, so some means for heat dissipation such as preventing damage by irradiation to the area around the solar cell element is needed.

Also, a concentrating solar power generation apparatus is often installed in deserts and other locales subject to extreme changes in temperature, so some means for dealing with thermal expansion caused by rising temperature is also necessary.

Specifically, to obtain a solar power generation apparatus with which electrical power can be reliably obtained from sunlight, it is extremely important to employ a suitable means for dealing with heat and light concentration in the mounting of the solar cell element, the adjustment of the positional relationship between the solar cell element and the optical system, and so forth.

The technology described herein was conceived in light of this situation, and it is an object thereof to provide a concentrating solar power generation unit and a concentrating solar power generation apparatus that comprise a mounting plate on which a solar cell element is mounted, a light shield that covers the mounting plate and has a transmission hole for transmitting sunlight, a concentrating lens for concentrating sunlight on the light receiving region of the solar cell element, and a frame for aligning the solar cell element and the concentrating lens, the result of which is that assembly is easier, productivity is higher, maintenance (repair and inspection) work is easier, optical members can be easily aligned, and the effect is excellent with respect to heat and sunlight.

Meanwhile, problems with the above-mentioned concentrating solar power generation apparatus 100 shown in FIG. 17 are that the tubular reflecting mirrors 105 corresponding to the solar cell elements 104 are needed to concentrate the sunlight Ls, and that frames corresponding to each of the non-imaging Fresnel lenses 102 have to be formed in the case 101 to support the non-imaging Fresnel lenses 102, and so forth, all of which makes the optical system more complicated and the manufacturing process more complicated.

Also, since the non-imaging Fresnel lenses 102 are supported by the frames of the case 101, there is a limit to how big the case can be, and a problem is that it is difficult to obtain a concentrating solar power generation apparatus 100 capable of concentrating light over a large surface area.

Also, since the non-imaging Fresnel lenses 102 are supported by the frames of the case 101, alignment is difficult (for example, the precision of the frame shape has to be increased, and every frame has to be aligned with the concentrating positions), and the manufacturing process is more complicated, and also, precise alignment is difficult.

Also, when a reflection tube or other such secondary optical system is used, the sunlight that reaches the solar cell elements 104 always passes through the reflection tube, etc., so a problem is that optical loss is caused by reflection or poor transmissivity of the reflection tube itself.

The technology described herein was conceived in light of this situation, and it is an object thereof to provide a concentrating lens, a concentrating lens structure, and a method for manufacturing the same, with which concentration is even over the entire concentrating region (the light receiving region of the solar cell element), reliable concentration is possible, and concentration efficiency can be improved, by using a concentrating lens comprising a flat first face and a second face on which is formed a flat region parallel to the first face and a protruding region having inclined faces that are inclined with respect to the first face, or by using a concentrating lens structure in which this concentrating lens is supported by a translucent substrate.

It is another object of the technology described herein to provide a concentrating lens structure with which the flat region of a concentrating lens is utilized to align the concentrating lens and a concentrating region, which allows precise alignment to be easily accomplished with a simple optical system, so the manufacturing process can be simplified and concentration efficiency can be increased, and to provide a method for manufacturing this concentrating lens structure.

It is another object of the technology described herein to provide a concentrating solar power generation apparatus that makes use of the above-mentioned concentrating lens structure, which allows precise alignment to be easily accomplished between the concentrating lens and the light receiving region (concentrating region) of the solar cell element, so the manufacturing process can be simplified, concentration efficiency can be increased, and also good power generation efficiency can be achieved.

The concentrating solar power generation unit according to the technology described herein is a concentrating solar power generation unit that generates electricity by irradiating a solar cell element with sunlight that has been concentrated with a concentrating lens, comprising a mounting plate on which the solar cell element is mounted, a light shield that has a transmission hole for irradiating a light receiving region of the solar cell element with sunlight and covers the mounting plate, a concentrating lens disposed across from the light shield, for concentrating sunlight on the light receiving region, and a frame for aligning and supporting the solar cell element and the concentrating lens.

Preferably, the light shield is formed integrally with the frame.

Preferably, the light shield has a bent portion in which the peripheral edge of the transmission hole is bent to the mounting plate side.

Preferably, the approximate middle of an end side of the mounting plate is fixed to the light shield, and the approximate middle of an end side of the concentrating lens is fixed to the upper end of the frame.

Preferably, a plurality of the solar cell elements are disposed on the mounting plate.

Preferably, the concentrating lens is disposed and supported on a translucent substrate corresponding to each of the plurality of solar cell elements.

Preferably, the approximate middle of an end side of the mounting plate in the lengthwise direction is fixed to the light shield.

Preferably, the approximate middle of an end side of the translucent substrate in the lengthwise direction is fixed to the upper end of the frame.

Preferably, the mounting plate and the translucent substrate are divided into a plurality of parts in the lengthwise direction of the frame.

The concentrating solar power generation apparatus according to the technology described herein is a concentrating solar power generation apparatus comprising a concentrating solar power generation unit, wherein the concentrating solar power generation unit is the concentrating solar power generation unit according to the technology described herein, and is constituted to allow tracking drive.

The concentrating lens according to the technology described herein is a concentrating lens having a flat first face and a second face on which are formed protrusions having an inclined face that is inclined with respect to the first face, wherein the second face comprises a flat region having a plane parallel to the first face, and a protruding region having the protrusions.

Preferably, the boundary between the flat region and the protruding region is demarcated by a step between the flat region and the protrusions.

Preferably, the flat region is demarcated by a circle having a diameter sufficient to surround the light receiving region of a solar cell element to be disposed across therefrom, and the protrusions are formed concentrically with respect to the flat region.

Preferably, the inclination angle of the inclined face with respect to the first face, and the inclination change pitch, which is the pitch at which this inclination angle is changed, are set so that light of a wavelength band that determines the short-circuit current of the solar cell element is concentrated on the light receiving region.

The concentrating lens structure according to the technology described herein is a concentrating lens structure comprising a concentrating lens having a flat first face and a second face on which are formed protrusions having an inclined face that is inclined with respect to the first face and a translucent substrate that fixes and supports this concentrating lens, wherein the second face comprises a flat region having a plane parallel to the first face, and a protruding region having the protrusions, and the concentrating lens and the translucent substrate are aligned by using a boundary demarcated by a step between the flat region and the protrusions.

Preferably, a flat region fixing portion that fixes the concentrating lens and the translucent substrate so as to correspond to the flat region, and a peripheral edge fixing portion that fixes the concentrating lens and the translucent substrate so as to correspond to the peripheral edge of the protruding region, are formed between the translucent substrate and the first face.

Preferably, the flat region fixing portion and the peripheral edge fixing portion are formed by double-sided adhesive tape.

Preferably, a filled portion that is filled with an adhesive agent is formed between the translucent substrate and the first face.

Preferably, a plurality of the concentrating lenses are lined up on the translucent substrate.

The concentrating solar power generation unit according to the technology described herein is a concentrating solar power generation unit comprising a concentrating lens structure equipped with a concentrating lens and a translucent substrate that fixes and supports the concentrating lens, and a solar cell element disposed corresponding to the concentrating lens.

The concentrating lens structure manufacturing method according to the technology described herein is a method for manufacturing a concentrating lens structure that comprises a concentrating lens having on a second face a flat region having a plane parallel to a planar first face, and a protruding region in which are formed protrusions having an inclined face that is inclined with respect to the first face, and a translucent substrate that fixes and supports this concentrating lens, with the concentrating lens and the translucent substrate being aligned so that the flat region and a concentrating region faces each other, said method comprising the steps of aligning the flat region with a flat positioning piece of a positioning jig base provided with this flat positioning piece for determining the position of the flat region and with a substrate end positioning piece for determining the position of the end of the translucent substrate, forming a flat region fixing portion for fixing the concentrating lens and the translucent substrate at positions corresponding to the flat region on the first face, forming a peripheral edge fixing portion for fixing the concentrating lens and the translucent substrate at positions corresponding to the peripheral edge of the protruding region on the first face, butting the end of the translucent substrate against the substrate end positioning piece and joining the translucent substrate to the flat region fixing portion and the peripheral edge fixing portion, and filling the space between the translucent substrate and the concentrating lens with an adhesive agent.

The concentrating solar power generation unit and concentrating solar power generation apparatus according to the technology described herein include a light shield that covers a solar cell element and a mounting plate on which the solar cell element is mounted, and a frame that demarcates the positional relationship of the solar cell element and the concentrating lens, and the mounting plate and frame are configured separately, so productivity is improved due to the mounting of the solar cell element to the mounting plate, etc., maintenance and inspection are easier, workability and reliability are improved.

Also, since the alignment of the mounting plate and the translucent substrate (concentrating lens) with respect to the transmission hole can be accomplished using the structural members (frame and light shield) as a reference shape, it is easier to ensure precise alignment of the optical members (concentrating lens and translucent substrate) and the solar cell element. Also, because alignment precision can be enhanced, the irradiating sunlight can be utilized more efficiently.

Another effect of the concentrating solar power generation unit and concentrating solar power generation apparatus according to the technology described herein is that since the light shield prevents sunlight from irradiating the mounting plate on which the solar cell element is mounted, the mounting plate on which the solar cell element is mounted can be prevented from being damage.

With the concentrating lens according to the technology described herein, since the flat region is disposed across from the light receiving region, sunlight that is incident perpendicular to the flat region is also incident perpendicular to the light receiving region, and the sunlight incident on the protruding region is bent by the inclined faces and concentrated in the light receiving region. Therefore, the light incident on the flat region has no chromatic aberration caused by the concentrating lens, there is less variance in the optical intensity distribution at the light receiving face of the solar cell element, and power generation efficiency can be increased.

With the concentrating lens structure and its method of manufacture according to the technology described herein, since the concentrating lens and the translucent substrate (concentrating region) are aligned by using the boundary between the flat region and the protruding region, it is easy to accomplish precise alignment, and the manufacturing process can be simplified. Also, the mechanical strength of the concentrating lens can be increased by the translucent substrate, so the concentrating lens can have the shape required for concentrating light, and it is possible to provide a concentrating lens structure that has the desired concentration characteristics and is capable of concentration over a large surface area.

With the concentrating solar power generation unit according to the technology described herein, because the concentrating lens structure according to the technology described herein is used, the manufacturing process is simple and it is possible to provide a concentrating solar power generation apparatus with good concentration characteristics and high power generation efficiency and reliability.

DESCRIPTION OF REFERENCE NUMERALS

Figure 1:
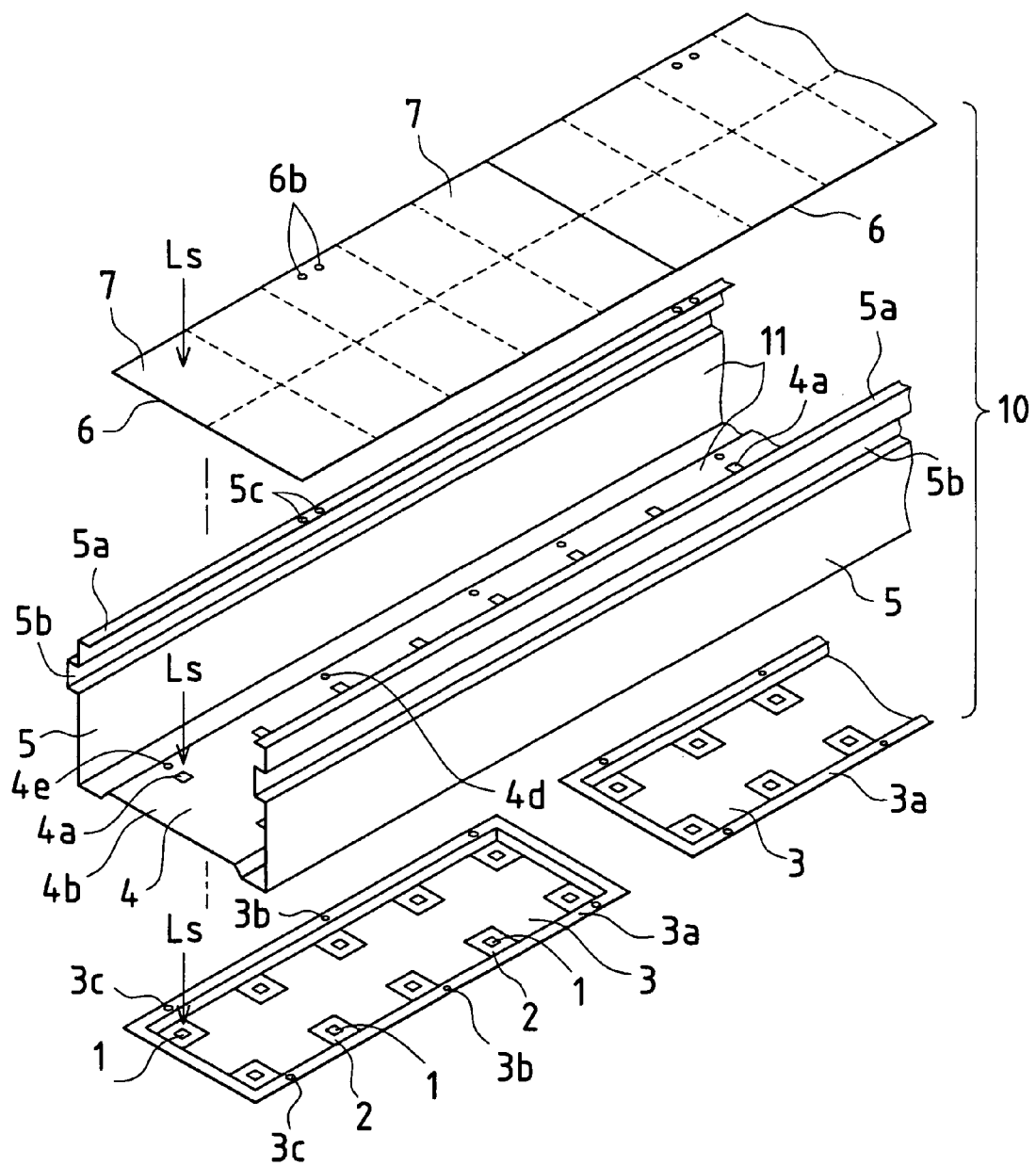
FIG. 1 is an exploded perspective view partially illustrating the layout relationship of the main portions of the concentrating solar power generation unit according to Embodiment 1 of the technology described herein.

1 solar cell element
2 receiver
3 mounting plate
3a flange
3b mounting plate alignment portion
4 light shield
4b frame bottom
4a transmission hole
4c bent portion
4d mounting plate protrusion
4s surface (incident-side surface)
5 frame
5a flange
5b mating groove
5c flange protrusion
6 translucent substrate
6a border
6b substrate border alignment portion
7 concentrating lens
7b boundary
7f first face
7p protrusion
7s second face
7sf flat region
7sp protruding region
8 concentrating lens structure
8a flat region fixing portion
8b peripheral edge fixing portion
8c filled portion
10 concentrating solar power generation unit
11 structure
15 positioning jig base
15a flat positioning piece
15b lens anti-rotation piece
15c substrate edge positioning piece
20 concentrating solar power generation apparatus
21 main beam
22 power generation module
23 power generation module
24 main beam linking portion
26 support column
Ls sunlight
h protrusion height
ph inclination change pitch
pp pitch
θ angle of inclination Embodiments of the technology described herein will now be described through reference to the drawings.

EMBODIMENT 1

Figure 2:
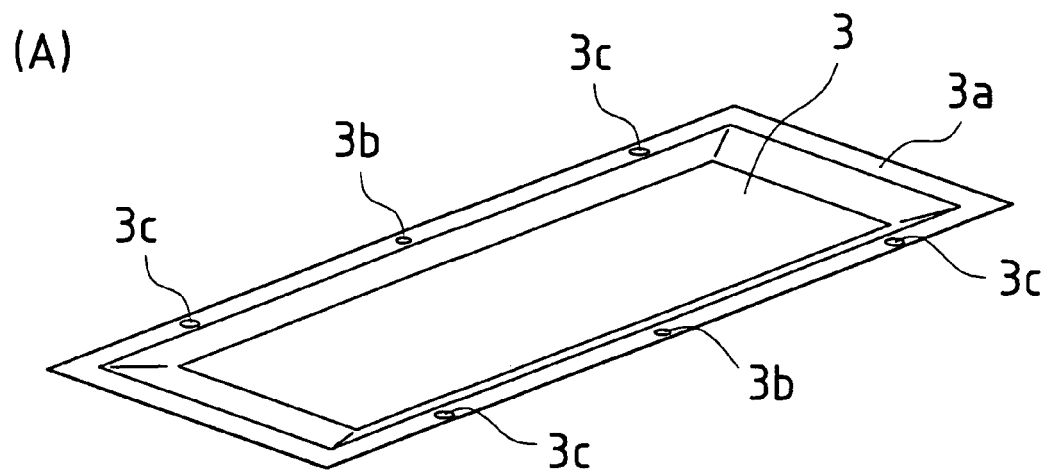
FIG. 2 is an explanatory diagram illustrating the positioning and fixing state of the frame bottom and the mounting plate of the concentrating solar power generation unit in FIG. 1, with FIG. 2(A) being an oblique view of the mounting plate, FIG. 2(B) a cross-sectional view of a positioned and fixed state, and FIG. 2(C) a cross-sectional view of a loosely fixed state.
Figure 2:
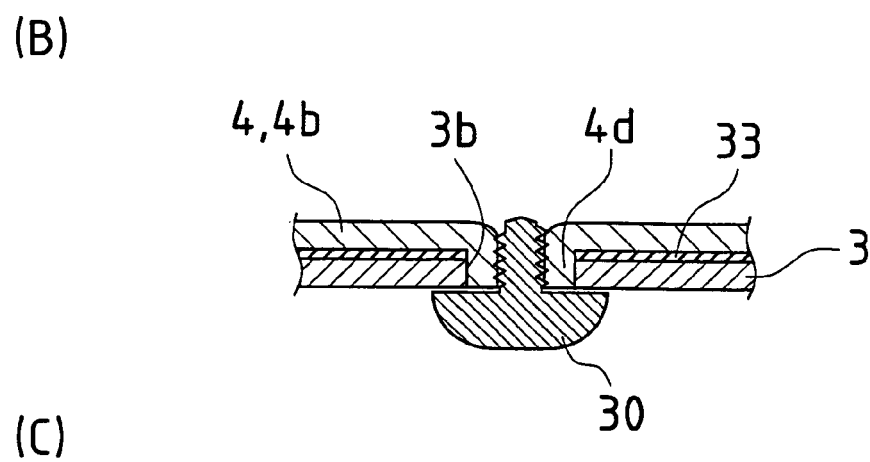
Figure 2:
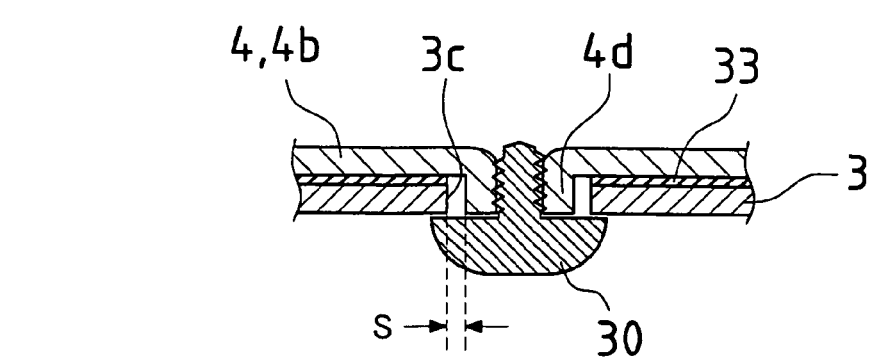
Figure 3:
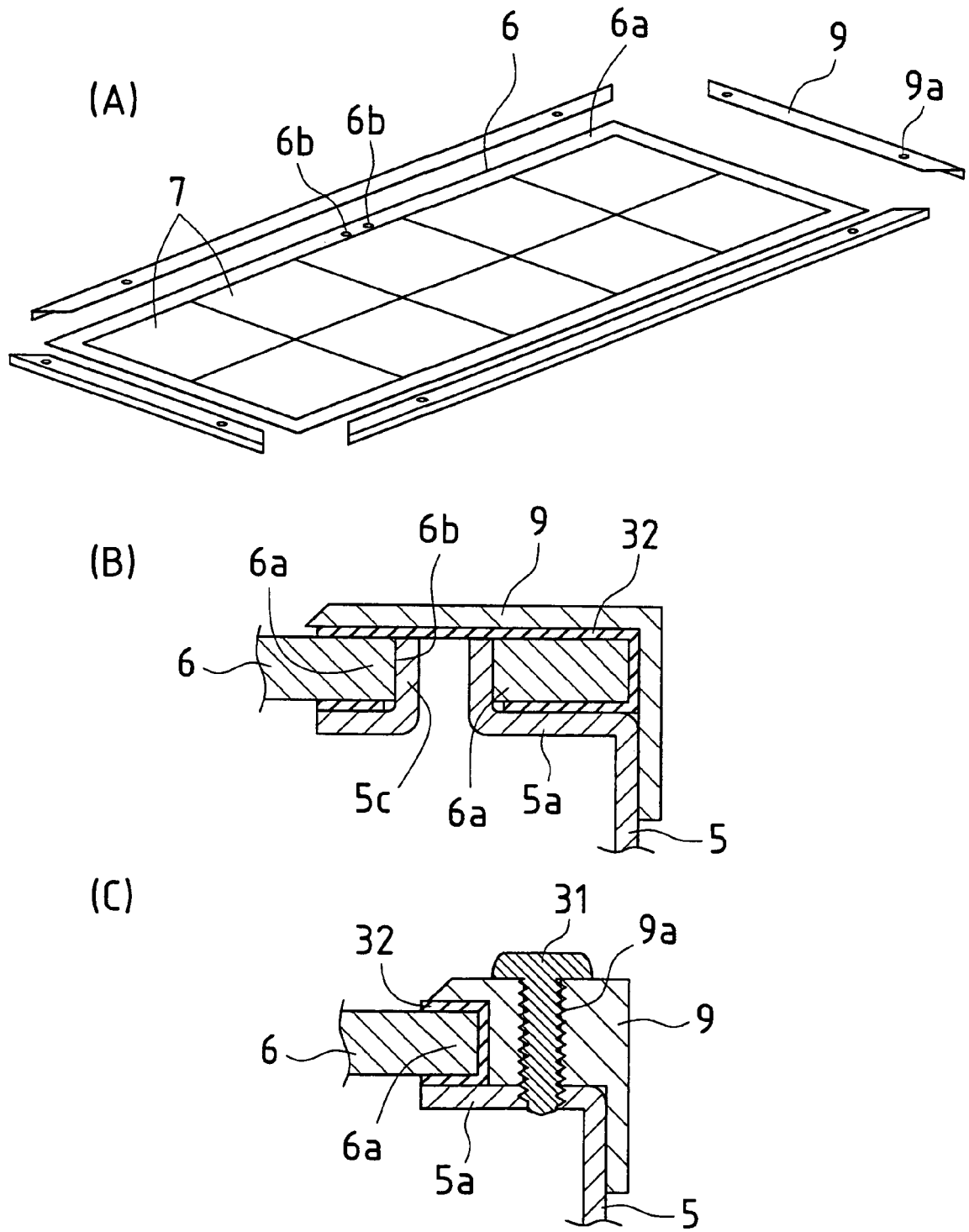
FIG. 3 is an explanatory diagram illustrating the positioning and fixing state of the frame upper end and the translucent substrate of the concentrating solar power generation unit in FIG. 1, with FIG. 3(A) being a perspective view of the translucent substrate, etc., FIG. 3(B) a cross-sectional view of a positioned and fixed state, and FIG. 3(C) a cross-sectional view of a fixed state.

FIG. 1 is an exploded perspective view partially illustrating the layout relationship of the main portion of the concentrating solar power generation unit according to Embodiment 1 of the technology described herein. FIG. 2 is an explanatory diagram illustrating the positioning and fixing state of the frame bottom and the mounting plate of the concentrating solar power generation unit in FIG. 1, with FIG. 2(A) being a perspective view of the mounting plate, FIG. 2(B) a cross-sectional view of a positioned and fixed state, and FIG. 2(C) a cross-sectional view of a loosely fixed state. FIG. 3 is an explanatory diagram illustrating the positioning and fixing state of the frame upper end and the translucent substrate of the concentrating solar power generation unit in FIG. 1, with FIG. 3(A) being a perspective view of the translucent substrate, etc., FIG. 3(B) a cross-sectional view of a positioned and fixed state, and FIG. 3(C) a cross-sectional view of a loosely fixed state.

A concentrating solar power generation unit 10 of this embodiment includes solar cell elements 1, a mounting plate 3 on which are mounted the solar cell elements 1 that are bonded to receivers 2, a light shield 4 that covers the mounting plate 3, frames 5 disposed vertically from the ends on two opposite sides of the light shield 4, concentrating lenses 7 that are disposed corresponding to the upper ends of the frames 5 across from the light shield 4 and that concentrate sunlight Ls on the light receiving regions of the solar cell elements 1, and a translucent substrate 6 that fixes (fastens) the concentrating lenses 7 and is mounted to the upper ends of the frames 5.

Because there are fewer constituent members corresponding to function, assembly is easier, the product can be smaller and lighter, and the concentrating solar power generation unit 10 has high mechanical strength. In other words, because the member configuration corresponds to function and the structure is simplified, mechanical strength and productivity can both be increased. Also, because the optical distance is demarcated by the frames 5 which have high mechanical strength, stable and effective concentration is possible, and highly reliable power generation is possible with no risk of damage because the mounting plate 3 is covered by the light shield 4.

There are, for example, two rows of five (for a total of ten) solar cell elements 1 mounted on the receivers 2 and disposed on the mounting plate 3. The solar cell elements 1 are disposed corresponding to the concentration positions of the concentrating lenses 7. The mounting plate 3 is formed in a dish shape having a recess that leaves space to hold the solar cell elements 1 and the receivers 2 in a unit of ten each, and a flange 3a is formed around the peripheral edge for attaching to the light shield 4.

The mounting plate 3 is preferably made from aluminum for example, considering lightness, heat radiation, etc. The aluminum may be subjected to a suitable insulating treatment such as alumite processing. Also, the mounting plate 3 is mounted on the light shield 4, holds ten of the solar cell elements 1 along with the light shield 4, and forms a protective space that protects the solar cell elements 1 from the external environment.

The concentrating lenses 7 are disposed in two rows of five (for a total of ten) on the translucent substrate 6 so as to correspond to each of the ten solar cell elements 1, and are fixed to constitute a lens array (6, 7). The concentrating lenses 7 are made from an acrylic resin for example, considering workability and translucency. The lens material may also be a polycarbonate or glass.

The translucent substrate 6 is made from glass for example, considering translucency, strength, resistance to the environment, etc., so as to prevent damage by the weather in the surrounding environment. The concentrating lenses 7 are bonded and supported on the translucent substrate 6 by a suitable adhesive agent that is translucent. The material of the translucent substrate 6 may also be an acrylic resin or a polycarbonate.

The concentrating lenses 7 are adjusted for optical distance (determined based on the focal distance) so as to concentrate light in the light receiving regions of the solar cell elements 1, and therefore the sunlight Ls concentrated by the concentrating lenses 7 has extremely high energy at the layout side of the solar cell elements 1. When the configuration allows the sunlight Ls to be tracked, the solar cell elements 1 will not always be able to maintain a facing relationship with respect to the concentrated sunlight Ls, and situations are also envisioned in which the tracking apparatus shuts down due to occurrence of abnormal conditions. That is, there is the risk that the concentrated sunlight Ls will irradiate not only the light receiving regions of the solar cell elements 1, but also the mounting plate 3 or the surrounding members of the mounting plate 3 other than the light receiving region, in which case there is the risk of burning or other damage to the irradiated portions.

Therefore, the light shield 4 is structured to block the sunlight Ls so as to prevent damage from the concentrated sunlight Ls, and the constitution is such that the sunlight Ls will have no effect outside the light receiving regions of the solar cell elements 1. Also, transmission holes 4a, which transmit the concentrated sunlight Ls and allow it to irradiate the light receiving regions of the solar cell elements 1, are provided and aligned so as to be across from the light receiving regions of the solar cell elements 1, so that light can be received by the solar cell elements 1, in addition to the light shielding function of the light shield.

In other words, the transmission holes 4a are made corresponding to each of the ten solar cell elements 1 mounted on the mounting plate 3, and matching up the positions of the solar cell elements 1 and the concentration positions of the concentrating lenses 7 with the positions of the transmission holes 4a is extremely important to ensure good power generation efficiency. Also, the light shield 4 is disposed corresponding to the bottoms of the frames 5, near the mounting plate 3, to reliably realize the action of the transmission holes 4a.

To ensure and increase the mechanical strength of the concentrating solar power generation unit 10, and to boost productivity, the frames 5 are preferably formed integrally by continuous molding. It is also preferable for the frames 5 to be integrated with the light shield 4 located between the two frames 5. To this end, the light shield 4 and the frames 5 are integrally formed, for example, by roll forming sheet metal, such as sheet iron or sheet steel. The sheet iron or sheet steel is preferably subjected to a rust proofing treatment such as zinc plating.

Therefore, the light shield 4 constitutes the bottom of a structure 11 of the concentrating solar power generation unit 10, while the frames 5 constitute the side walls of the structure 11, and this reliably increases the strength of the structure (structural framework) 11 of the concentrating solar power generation unit 10.

Integrating the light shield 4 with the frames 5 increases productivity because there is no need to use a separate member as the light shield 4. Also, since the position of the light shield 4 (the transmission holes 4a) is demarcated, the alignment of the mounting plate 3 with respect to the concentrating lenses 7 can be performed more precisely.

The light shield 4 formed integrally with the frames 5 during roll forming constitutes a frame bottom 4b that protrudes upward toward the upper ends of the frames 5 in order to mount the mounting plate 3. The light shield 4 formed integrally with the frames 5 will herein sometimes be referred to as the frame bottom 4b for the sake of convenience.

Next, the specific structure for matching the position of the solar cell elements 1 to the position of the transmission holes 4a will be described. Mounting plate protrusions 4d are provided to the frame bottom 4b, and mounting plate alignment portions 3b corresponding to the mounting plate protrusions 4d are formed in the mounting plate 3 (the flange 3a) (see FIG. 2(A)), which facilitates positioning of the mounting plate 3 in a direction that intersects the sunlight Ls. In other words, the mounting plate protrusions 4d of the frame bottom 4b are mated with the mounting plate alignment portions 3b of the mounting plate 3, and the portions are fixed with screws 30 or the like (see FIG. 2(B)). In this embodiment, the mounting plate alignment portions 3b are provided in the approximate center of two end sides (on the flange 3a) across from each other in the lengthwise direction of the mounting plate 3, and the mounting plate 3 is fixed to the frame bottom 4b.

Furthermore, mounting plate protrusions 4e are provided to the frame bottom 4b separately from the mounting plate protrusions 4d, and mating portions 3c corresponding to the mounting plate protrusions 4e are formed in the mounting plate 3 (flange 3a) (see FIG. 2(A)), allowing the mounting plate 3 to be loosely fixed to the frame bottom 4b. In other words, the mounting plate protrusions 4e of the frame bottom 4b are mated with the mating portions 3c via a space S between the mounting plate protrusions 4e and the mounting plate 3, and are fixed with screws 30 or the like (see FIG. 2(C)). A cushioning material 33 may be sandwiched between the frame bottom 4b and the mounting plate 3.

The mounting plate protrusions 4d and 4e provided to the frame bottom 4b may instead be concave, and the mounting plate alignment portions 3b and mating portions 3c may be convex, and as long as positioning and fixing can be accomplished, the shape does not matter.

Next, the specific structure for matching the concentrating position of the concentrating lenses 7 to the position of the transmission holes 4a will be described. A flange 5a for supporting the translucent substrate 6 (concentrating lenses 7) is formed integrally during roll forming at each of the upper ends of the frames 5, allowing the concentrating lenses 7 to be positioned more reliably.

Also, flange protrusions 5c (see FIG. 1) are provided to the flanges 5a of the frames 5, and substrate border alignment portions 6b corresponding to the flange protrusions 5c are formed in the approximate center of the edge (border 6a) in the lengthwise direction of the translucent substrate 6 (see FIG. 3(A)), which facilitates the positioning of the translucent substrate 6 (concentrating lenses 7) in a direction that intersects the sunlight Ls. The flange protrusions 5c provided to the flanges 5a may instead be concave, and as long as positioning can be accomplished, the shape does not matter.

Instead of using the flange protrusions 5c, the border 6a may be fixed to the flanges 5a by casting a silicone resin or other such material that cures at normal temperature onto the substrate border alignment portions 6b. In positioning, the optical alignment of the solar cell elements 1 and the concentrating lenses 7 is accomplished by geometric measurement, generated output measurement, or the like, and the translucent substrate 6 may first be tacked to the flanges 5a and then fixed with a resin.

If a pair of the substrate border alignment portions 6b are formed close together in the approximate center of an edge of the translucent substrate 6 in its lengthwise direction, the orientation of the translucent substrate 6 (concentrating lenses 7) can be fixed without rotation, and the translucent substrate 6 will be fixed to the flanges 5a with less stress due to thermal expansion (see FIG. 3(B)).

Also, the border 6a of the translucent substrate 6 is preferably held down by retaining members 9 so that the translucent substrate 6 can expand and contract, and if a cushioning material 32 is wound over the end faces of the translucent substrate 6 and the retaining members 9 are fixed to the flanges 5a with bolts 31 that pass through retainer holes 9a, the translucent substrate 6 will be protected against mechanical stress and made water-tight. That is, because the translucent substrate 6 is fixed by just the substrate border alignment portions 6b, and is loosely held down by the retaining members 9, it is not subjected to expansion and contraction stress due to thermal expansion or the like (see FIG. 3(C)).

Therefore, the mounting plate 3 and the translucent substrate 6 can be accurately aligned using the frames 5 and the light shield 4 as the reference positions (basic shape) of the structure, and this affords more accurate light concentration.

The translucent substrate 6 that fixes the concentrating lenses 7 is mounted at the upper ends (flanges 5a) of the frames 5. Also, because the concentrating lenses 7 is required to be disposed so that the sunlight Ls that passes through the concentrating lenses 7 is concentrated on the light receiving regions of the solar cell elements 1, the height of the frames 5 (the side walls of the structure 11) is set so as to demarcate the necessary optical distance between the solar cell elements 1 and the concentrating lenses 7 (the distance required to generate the maximum power), taking into account the focal distance of the concentrating lenses 7.

In other words, the height of the frames 5 is set so that when the solar cell elements 1 and the sunlight Ls are facing each other, the sunlight incident on the lens region of the concentrating lenses 7 passes through the transmission holes 4a of the light shield 4 and reliably irradiates the entire light receiving regions of the solar cell elements 1 mounted on the receivers 2.

Mating grooves 5b that allow the frames 5 to be mated together are integrally formed during roll forming in the lengthwise direction of the frames 5. A concentrating solar power generation apparatus 20 (see Embodiment 2) can be constituted by mating the mating grooves 5b and linking a plurality of frames 5 in the short-side direction intersecting the lengthwise direction. Because the mating grooves 5b allow the frames 5 to be mated together, the structure 11 can be maintained at high mechanical strength even when a plurality of frames are linked.

The mounting plate 3 and the translucent substrate 6 are mounted such that they are divided into a plurality of parts in the lengthwise direction of the frames 5. With this constitution, even when the frames 5 are lengthened in their lengthwise direction in order to increase the size of the concentrating solar power generation unit 10, assembly will still be easy, which means that productivity is higher, and maintenance, inspection, repair, and so forth can be carried out more easily.

Also, if the mounting plate 3 and the translucent substrate 6 are shortened with respect to the length of the frames 5 in their lengthwise direction, the alignment of the solar cell elements 1 and the concentrating lenses 7 with respect to the frames 5 may be performed over a narrower range (a divided range) with respect to the frames 5 (the transmission holes 4a), so alignment can be performed more precisely.

In particular, when the mounting plate 3, the frames 5, and the translucent substrate 6 are each made of a different material, each will have a different coefficient of thermal expansion, so the greater the length, the greater the effect of thermal expansion, and there is the risk that positional shift caused by temperature changes will keep the concentrated sunlight Ls from irradiating the solar cell elements 1. However, if the mounting plate 3 and the translucent substrate 6 are divided up to make them shorter, the thermal expansion only has to be taken into account for a shorter length (over a narrower range), so the effect of thermal expansion can be reduced.

In other words, when the mounting plate 3 and the translucent substrate 6 are divided into a plurality of parts in the lengthwise direction of the frames 5, positional shift caused by the difference in thermal expansion accompanying the difference in materials of the mounting plate 3, the translucent substrate 6, and the frames 5 can be reduced, accurate concentration and power generation will be possible even in high temperature environments, and a concentrating solar power generation unit 10 with high reliability will be obtained.

Also, the effect of positional shift caused by thermal expansion can be reduced by fixing the approximate center of the edges of the translucent substrate 6 in its lengthwise direction to the upper ends (flanges 5a) of the frames 5.

Furthermore, the effect of rotational shift caused by thermal expansion can be reduced by fixing the translucent substrate 6 at two or more places to the upper ends (flanges 5a) of the frames 5.

The mounting plate 3 and the translucent substrate 6 preferably correspond to the plurality of solar cell elements 1, but it should go without saying that the technology according to this embodiment can be applied even when the mounting plate 3 and the translucent substrate 6 are constituted individually corresponding to individual solar cell elements 1. That is, the concentrating solar power generation unit 10 can be constituted by fixing the approximate center of the edges of the mounting plate 3 to the light shield 4 corresponding to the individual solar cell elements 1, and fixing the approximate center of the edges of the concentrating lenses 7 to the upper ends of the frames 5.

Figure 4:
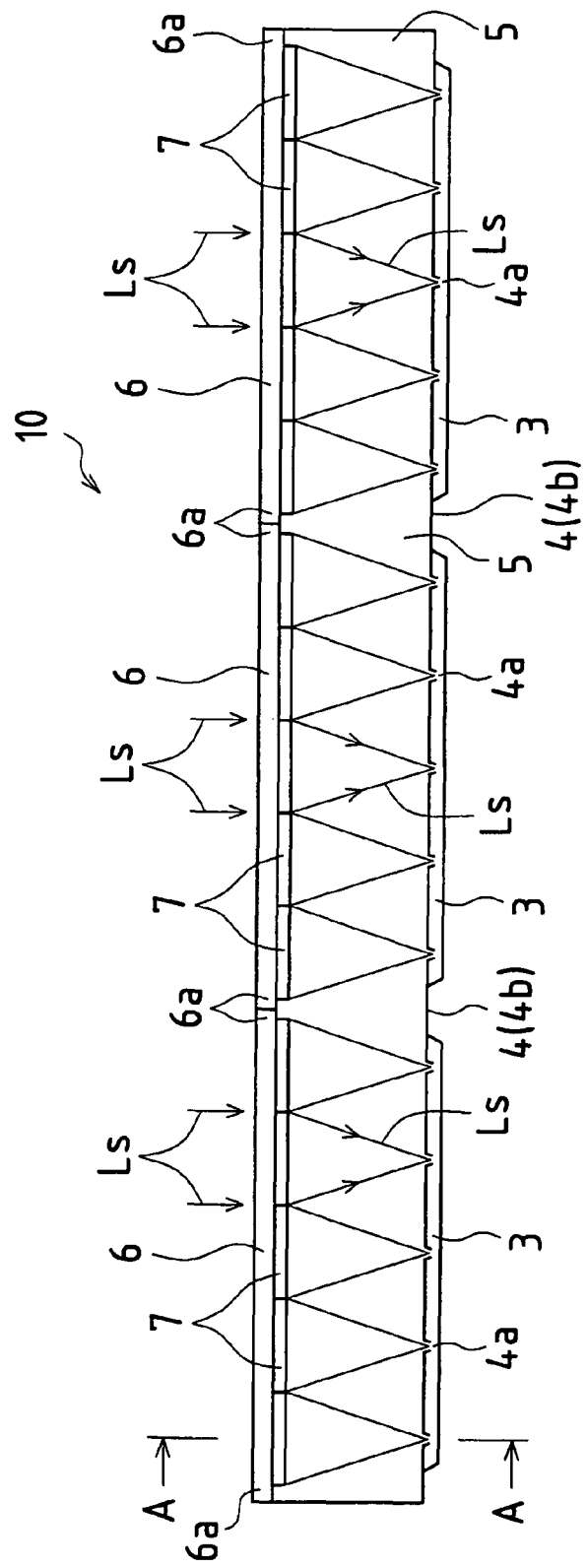
FIG. 4 is a schematic see-through side view illustrating the layout relationship of the main portions of the concentrating solar power generation unit according to Embodiment 1 of the technology described herein, as seen from the side in the lengthwise direction.
Figure 5:
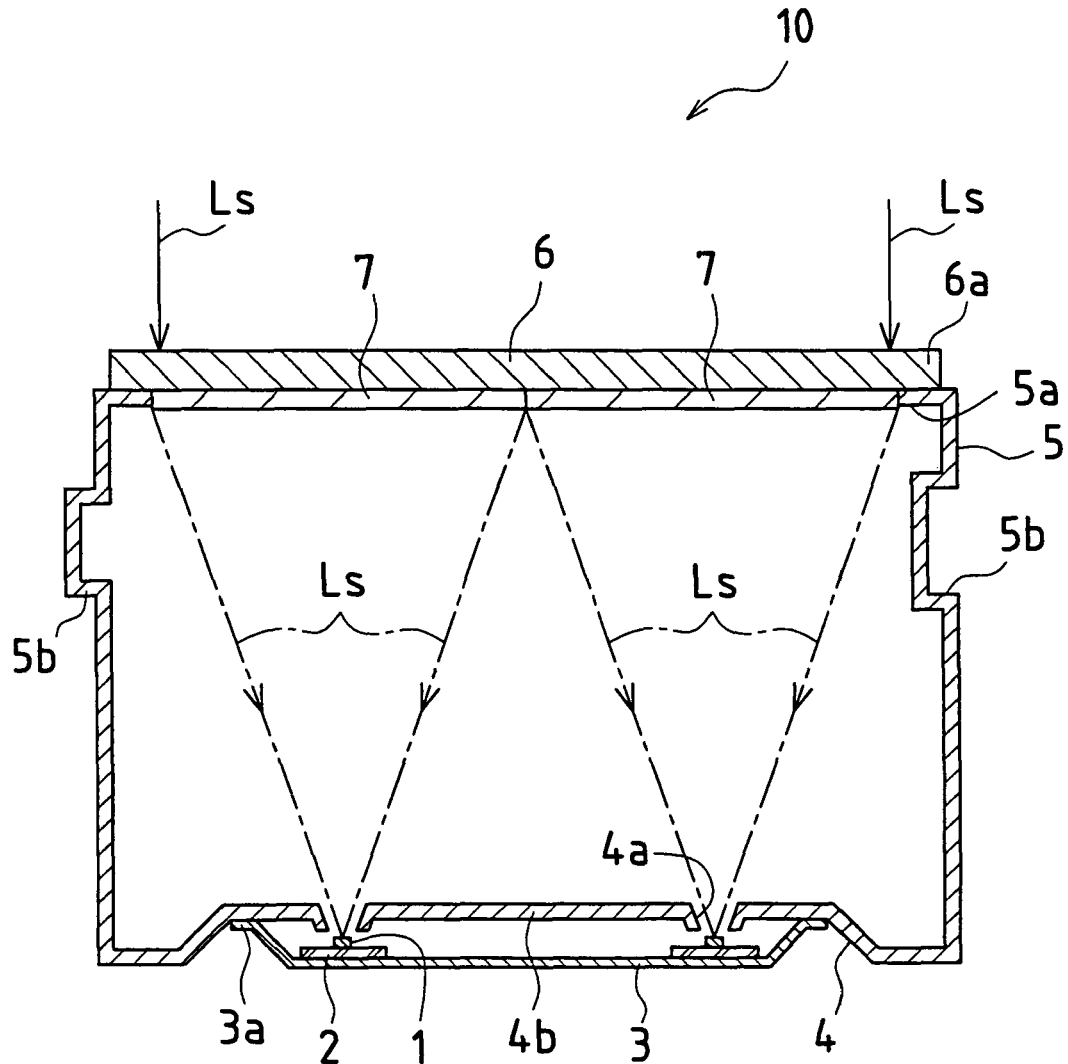
FIG. 5 is an enlarged cross-sectional view of cross section along the A-A line in FIG. 4.

FIG. 4 is a schematic see-through side view illustrating the layout relationship of the main portions of the concentrating solar power generation unit according to Embodiment 1 of the technology described herein, as seen from the side in the lengthwise direction. FIG. 5 is an enlarged cross-sectional view of the schematic cross section along the A-A line in FIG. 4. In FIG. 4, the solar cell elements 1 and the receivers 2 are not shown.

The frames 5 are produced by drawing out rolled sheet metal (such as sheet iron or sheet steel) into a flat shape, continuously transferring the mounting plate protrusions 4d and 4e (see FIG. 2) and the flange protrusions 5c (see FIG. 3) onto the flat sheet by pressing with a plane mold, and performing three-dimensional working of the pressed locations by roll forming. It is preferable here for the mold to press in a unit length specified by the mounting plate 3 or the translucent substrate 6. A preform formed by continuous bending by roll forming in this way can be cut to about 3 m in the lengthwise direction, which is a size suited to the concentrating solar power generation units 10 that make up the concentrating solar power generation apparatus 20 (see Embodiment 2).

That is, with the concentrating solar power generation unit 10 according to this embodiment, a structure with high precision can be formed with good productivity in the required length by forming the light shield 4 and the frames 5 by roll forming of sheet metal.

The mounting plate 3 and the translucent substrate 6, which have been divided into a plurality of parts (say, three) about 1 m in length, are disposed in the lengthwise direction of the frames 5 at the lower and upper portions of the frames 5, respectively, and fixed (mounted). Because they have been divided into a plurality of parts, the mounting plate 3 and the translucent substrate 6 are affected less by thermal expansion, according to the number of divisions. For instance, since the length of the translucent substrate 6 is about 1 m, the concentrating lenses 7, five of which are lined up in the lengthwise direction, are about 200 mm square. Therefore, the width of the translucent substrate 6 and the light shield 4 is about 400 mm. The width of the mounting plate 3 is about 300 mm.

The sunlight Ls that is incident from the surface of the translucent substrate 6 and passes through the concentrating lenses 7 is concentrated, passes through the transmission holes 4a of the light shield 4, and irradiates the solar cell elements 1 mounted on the mounting plate 3.

The mounting plate 3 is mounted with the flange 3a butted against the frame bottom 4b. The mounting plate 3 is positioned by the mounting plate alignment portions 3b formed in the approximate center in the lengthwise direction of the flange 3a corresponding to the long sides (edges in the lengthwise direction) of the mounting plate 3, and is securely fixed to the frame bottom 4b by the screws 30 or other suitable fasteners (see FIG. 2). The flange 3a at other positions is latched (loosely fixed) to the frame bottom 4b by the screws 30 or other suitable fasteners at the mating portions 3c (see FIG. 2). That is, positional shift caused by thermal expansion can be halved compared to that when positioning is done at the corners, for example, by positioning and fixing in the approximate center of the edges in the lengthwise direction of the mounting plate 3.

Also, when all four sides of the mounting plate 3 are fixed at the same strength, the effect of warping and so forth caused by thermal expansion is greater, but the occurrence of warping (bending) and so forth can be prevented by securely fixing only near the center point along the long sides of the mounting plate 3 (flange 3a), and loosely fixing the other positions in a latched state. This allows the effect of thermal expansion to be reduced.

That is, by positioning and fixing near the center point on the long sides of the flange 3a (mounting plate 3) that is approximately 1 m long, the range over which positional shift due to thermal expansion has an effect can be cut in half, or about 0.5 m. In this fixing, it is preferable to provide two separated fixing points in the approximate center on the long sides of the flange 3a (mounting plate 3) so that the rotation of the mounting plate 3 will not cause any positional shift. The two separated fixing points may be disposed close to each other near the center point along the same long side, or they may be provided near the center points of a pair of sides when the two materials being fixed have similar coefficients of thermal expansion.

The translucent substrate 6 has its side on which the concentrating lenses 7 are attached facing the light shield 4, and just as with the mounting plate 3, is positioned with respect to the flanges 5a near the center point on the long sides (sides in the lengthwise direction) of the translucent substrate 6 (border 6a) at the border 6a formed around the region where the concentrating lenses 7 are attached. The effect with the translucent substrate 6 is the same as with the mounting plate 3, so positional shift can be suppressed. The border 6a is suitably fixed with respect to the flanges 5a by the retaining members 9 or other suitable fasteners (see FIG. 3). In between adjacent translucent substrates 6, they may be fixed by fasteners (not shown) of a shape that spans the two.

It is preferable here if the flange protrusions 5c are provided at fixing points of the flanges 5a corresponding to the substrate border alignment portions 6b formed on the border 6a, and the flanges 5a are mated with the substrate border alignment portions 6b (see FIG. 3) and fixed by the retaining members 9; installation or replacement can be easily performed without having to position the fixing position of the translucent substrate 6, so that maximum power generation output can be obtained.

Another method for fixing the translucent substrate 6 is to position the translucent substrate 6 and then cast an adhesive agent onto the substrate border alignment portions 6b and fix the border 6a to the flanges 5a.

Because the positioning and fixing of the mounting plate 3 and the translucent substrate 6 are performed at the same level of precision with respect to a common (the same) structure 11 (the light shield 4 and the flanges 5a), the positioning precision can be improved for the concentrating solar power generation unit 10 as a whole, allowing the efficiency with which sunlight is utilized to be reliably increased.

When ease of working during molding is taken into account, the concentrating lenses 7 are provided in a size of approximately 200 mm square corresponding to each of solar cell elements 1, an acrylic resin or the like is cast into a Fresnel lens-shaped mold, and the concentrating lenses 7 are formed as Fresnel lenses that are flat on one side. Using Fresnel lenses allows the concentrating lenses to be more lightweight, and light can be concentrated on the solar cell elements 1 with a small surface area by the concentrating lenses 7 with a large surface area. It is also possible for a plurality of Fresnel lenses to be formed integrally so as to correspond to a plurality of solar cell elements 1, instead of forming for each of the solar cell elements 1 separately. Also, since good strength and planarity can be ensured by bonding the concentrating lenses 7 to the translucent substrate 6, the product can be thinner, and it is possible to form a lens shape with good concentration characteristics.

Figure 6:
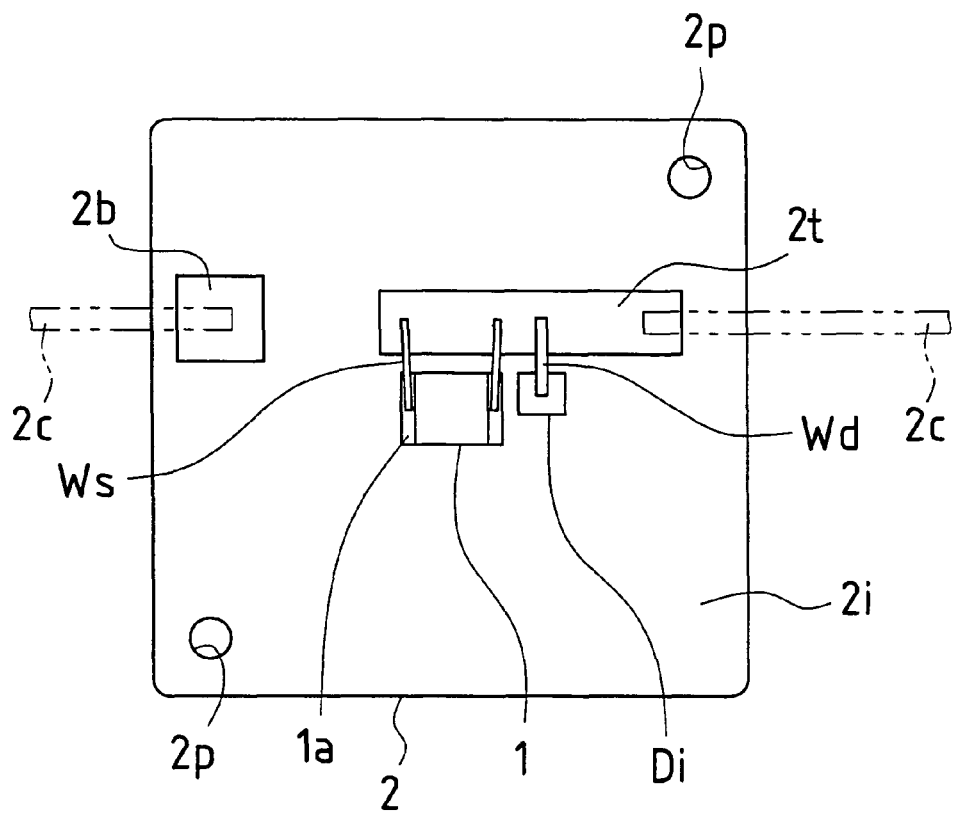
FIG. 6 is a plan view of the layout at the receiver of a solar cell element mounted on the concentrating solar power generation unit according to Embodiment 1 of the technology described herein.

FIG. 6 is a plan view of the layout at the receiver of a solar cell element mounted on the concentrating solar power generation unit according to Embodiment 1 of the technology described herein.

With this embodiment, the solar cell element 1 is worked into a chip with a light receiving region measuring 7 mm square from a wafer by forming a PN junction, electrode, etc., by known semiconductor manufacturing processes using a GaAs compound semiconductor. The solar cell element 1 is electrically and mechanically connected and bonded (mounted) by a rear electrode on a copper receiver 2 measuring about 60 mm square. Reference holes 2p are precisely made at diagonally opposite corners of the receiver 2, and the solar cell element 1 is positioned and bonded using these reference holes 2p as a reference.

A bypass diode Di is connected in parallel with the solar cell element 1, and when the solar cell element 1 operates as a resistor by blocking sunlight Ls or the like, a current path is constituted to an adjacent solar cell element 1, and the overall power generation function can be maintained even if a given solar cell element 1 should fail to perform its power generation function.

The surface of the receiver 2 is exposed in the region of a substrate electrode connection portion 2b, which is a region where the substrate electrode of the bypass diode Di is connected to the substrate electrode of the solar cell element that needs electrical connection, and the rest of the surface region is covered by an insulating resist $2i$. A surface electrode connection portion $2t$, which is an electrode for output take-off, is formed from a suitable thin conductor sheet on part of the surface of the insulating resist $2i$.

Surface electrodes $1a$ formed on the two facing chip ends of the solar cell element 1 are wire bonded to the surface electrode connection portion $2t$ via a wire Ws, allowing output to be taken off between the surface electrodes $1a$ and the substrate electrode connection portion $2b$. Also, the surface electrode of the bypass diode Di is wire bonded to the surface electrode connection portion $2t$ via a wire Wd, allowing bypass operation to be performed.

With this embodiment, an antireflective film is formed on the chip surface of the solar cell element 1, and while the reflectivity varies with the wavelength because of multiple reflections within the antireflective film, since the reflectivity tends to be higher as the incidence angle increases, reflection loss can be reduced at the light receiving region surface. A $TiO/Al_2O_2$ film is employed as this antireflective film. Part of the surface electrodes $1a$ is required to be exposed and electrically connected, but since the thickness is about 100 nm, wedge bonding is performed in which the wire head is melted by friction and bonded. That is, the antireflective film on the surface electrodes $1a$ is polished to expose part of the surface electrodes $1a$, and wire bonding is performed. Therefore, the surface electrodes $1a$ can be electrically connected to the surface electrode connection portion $2t$ without a step of removing the antireflective film.

The method for applying friction to the wire head in this wire bonding can be to oscillate in the lengthwise direction of the pattern of the surface electrodes $1a$, so that the short-side width of the surface electrodes $1a$ is set shorter. In this embodiment, it is sufficient for the rubbing width to be approximately two times the diameter of the wire Ws, and if the wire diameter is about 250 μm, the width of the bonded part will be about 750 μm.

Also, when there is only one wire Ws for each surface electrode $1a$, it is preferable for the apparatus that bonds the wire Ws to be near the center of the surface electrode $1a$ so that light can be concentrated more efficiently. There is only one wire Ws for each surface electrode $1a$ with this embodiment, but a plurality may instead be connected to each surface electrode $1a$. As long as the wire head can be rubbed in the lengthwise direction of the pattern of the surface electrode $1a$, then the wire Ws may be extended in any direction to the surface electrode connection portion $2t$, but it preferably follows the shortest path to the surface electrode connection portion $2t$.

The surface electrode connection portion $2t$ is preferably disposed perpendicular to the lengthwise direction of each surface electrode $1a$ in order to facilitate parallel connection of the solar cell element 1 and the bypass diode Di. If the surface electrodes $1a$ formed at both facing chip ends of the solar cell element 1 are electrically connected to the surface electrode connection portion $2t$ by wire bonding, the short-side width of the electrode shape can be set shorter, and the power generation surface area ratio per chip of the solar cell element 1 can be increased, so manufacturing cost can be reduced.

When electrodes and so forth that are opaque and of considerable thickness are present on the surface of the solar cell element 1, there is greater incident light loss due to electrode shadows produced by an increase in incidence angle, but this problem is mitigated with this embodiment in which the surface electrodes $1a$ are formed at both ends of the chip, so power generation is more efficient. Also, using the wire Ws reduces the surface area of the electrode that covers the surface of the solar cell element 1, which also increases power generation efficiency.

The solar cell element 1 and the bypass diode Di are preferably joined by wire bonding, by may instead be joined by soldering or welding.

Conductive leads $2c$ are connected to the surface electrode connection portion $2t$ and the substrate electrode connection portion $2b$ to allow connection to adjacent solar cell elements 1, and large-capacity power generation is possible by using the conductive leads $2c$ to connect the solar cell elements 1 in series or parallel.

A GaAs compound semiconductor solar cell was used as the solar cell element 1 in this embodiment, but the technology described herein is not limited to this, and may instead be applied to a silicon solar cell, or to a mechanical stacked solar cell in which these solar cells are combined.

Figure 7:
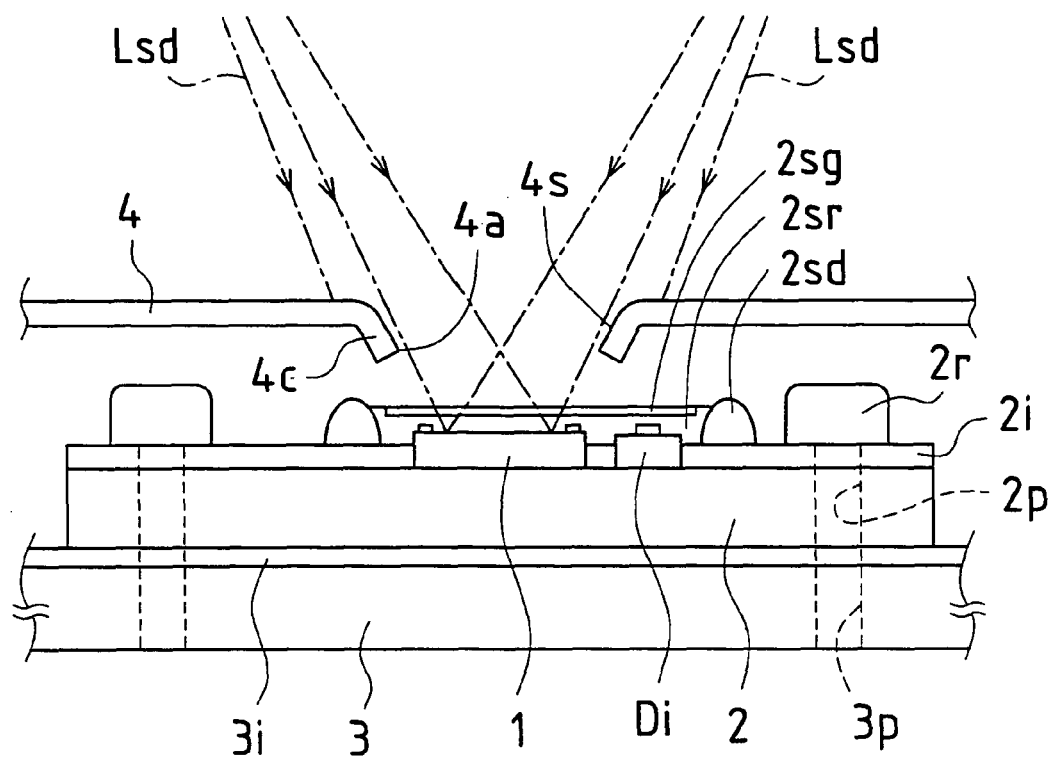
FIG. 7 is an explanatory diagram illustrating the layout of the transmission hole and the mounting state of the solar cell element mounted on the concentrating solar power generation unit according to Embodiment 1 of the technology described herein, with FIG. 7(A) being a side see-through view, and FIG. 7(B) a plan view of the light shield (transmission hole) from the concentrating lens side.
Figure 7:
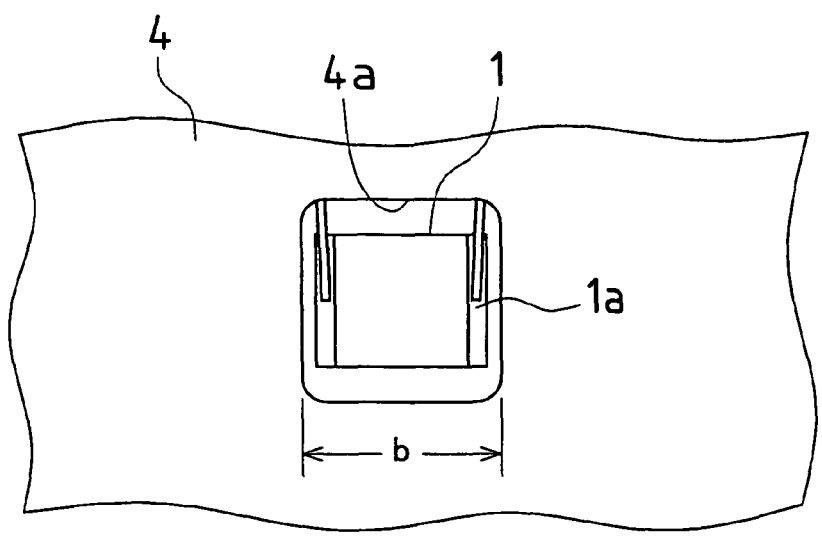

FIG. 7 is an explanatory diagram illustrating the layout of the transmission hole and the mounting state of the solar cell element mounted on the concentrating solar power generation unit according to Embodiment 1 of the technology described herein, with FIG. 7(A) being a side see-through view, and FIG. 7(B) a plan view of the light shield (transmission hole) from the concentrating lens side.

The bypass diode Di and the solar cell element 1 soldered to the exposed surface of the receiver 2 are surrounded (in plan view) by a sealing dam $2sd$ and sealed with a sealing resin $2sr$. Sealing glass $2sg$ is disposed on the surface of the sealing resin to improve the moisture resistance of the resin sealing (on the surface on the light shield 4 side). A suitable antireflective film of $MgF_2$ or the like may be formed over the sealing glass. The sealing dam $2sd$ is formed from a while silicone resin, for example, while the sealing resin $2sr$ is formed from a silicone resin with high translucence, for example. The resin sealing process includes a step of forming sealing dam $2sd$, a step of filling the inside of the sealing dam $4sd$ with the sealing resin $2sr$, and a step of placing glass on the surface of the suitably hard sealing resin $2sr$.

In this embodiment the receiver 2 is made of copper, and it functions as a heat dispersal means with respect to the solar cell element 1, which is at extremely high temperature when it is irradiated with the concentrated sunlight Ls. The receiver 2 on which the solar cell element 1 is mounted is bonded via an insulating thermally conductive sheet $3i$ on the aluminum mounting plate 3, and maintains a state of electrical insulation while dispersing the heat from the solar cell element 1 to the outside atmosphere from the mounting plate 3. A silicone rubber containing aluminum oxide or another insulating metal as a metal filler can be used as the insulating thermally conductive sheet $3i$. It is also possible to provide suitable heat radiating fins (not shown) to the mounting plate 3, and a particularly good heat radiation effect can be obtained by disposing these fins at locations corresponding to the receiver 2.

The positioning and fixing between the receivers 2 and the mounting plate 3 can be performed precisely by forming receiving holes $3p$ in the mounting plate 3 that are accurately aligned with respect to the reference holes $2p$ provided to the receivers 2, inserting rivets $2r$ having an insulating coating in the reference holes $2p$ and the receiving holes $3p$, and fixing these rivets.

The shape and size of the transmission holes $4a$ are such that the length b of the opening is 13 mm on all four sides, with respect to a solar cell element 1 having a $(7 \text{ mm})^2$ light receiving region and a concentrating lens 7 having a focal distance (the distance at which light is concentrated in planar form on the light receiving region of the solar cell element 1; the optical distance) of 300 mm. It should go without saying that the gap between the light shield 4 and the mounting plate 3 is suitably adjusted.

The transmission holes 4a can be punched out in a shape and size of b=13 mm on all four sides, but it is preferable to form a bent portion 4c around the edge by drawing the periphery around the transmission holes 4a, and impart the function (angle) of blocking the sunlight Ls that could possibly pass through at an angle and irradiate a portion other than the solar cell element 1.

In other words, the light shield 4 is constituted so as to have the bent portion 4c, in which the peripheral edge of the transmission hole 4a is bent to the mounting plate 3 side, which prevents the sunlight Ls that comes in obliquely to the transmission hole 4a from passing to the rear side of the light shield 4 (that is, the side with the mounting plate 3 and the solar cell element 1), so damage by the sunlight Ls around the periphery of the solar cell element 1 can be prevented.

Furthermore, the sunlight Ls that irradiates the bent portion 4c can be reflected to the solar cell element 1 side and the incidence efficiency raised by giving a mirror finish to a surface (incident-side surface) 4s on the concentrating lens 7 side of the bent portion 4c.

EMBODIMENT 2

Figure 8:
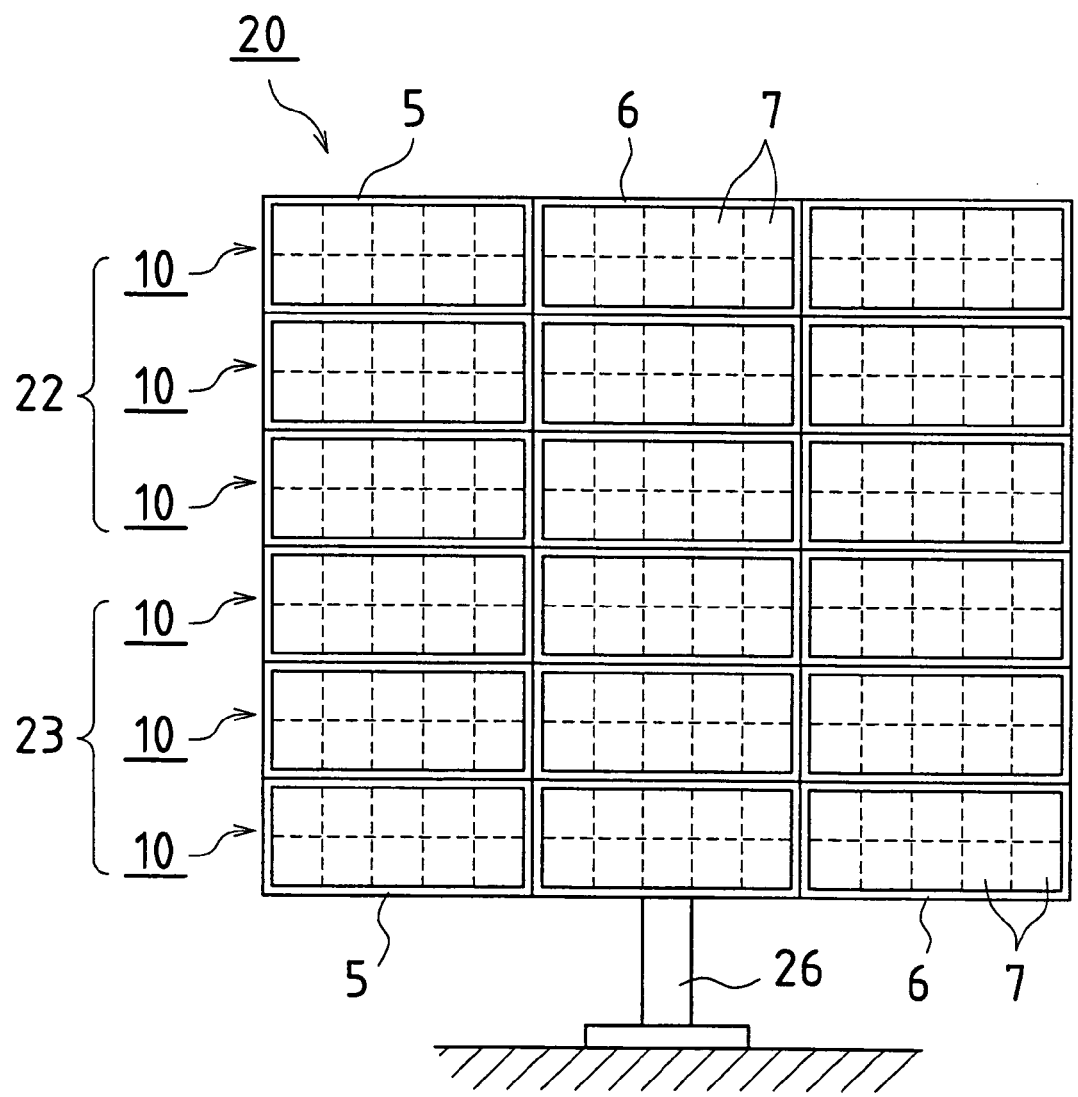
FIG. 8 is a schematic front view of the concentrating solar power generation apparatus according to Embodiment 2 of the technology described herein.
Figure 9:
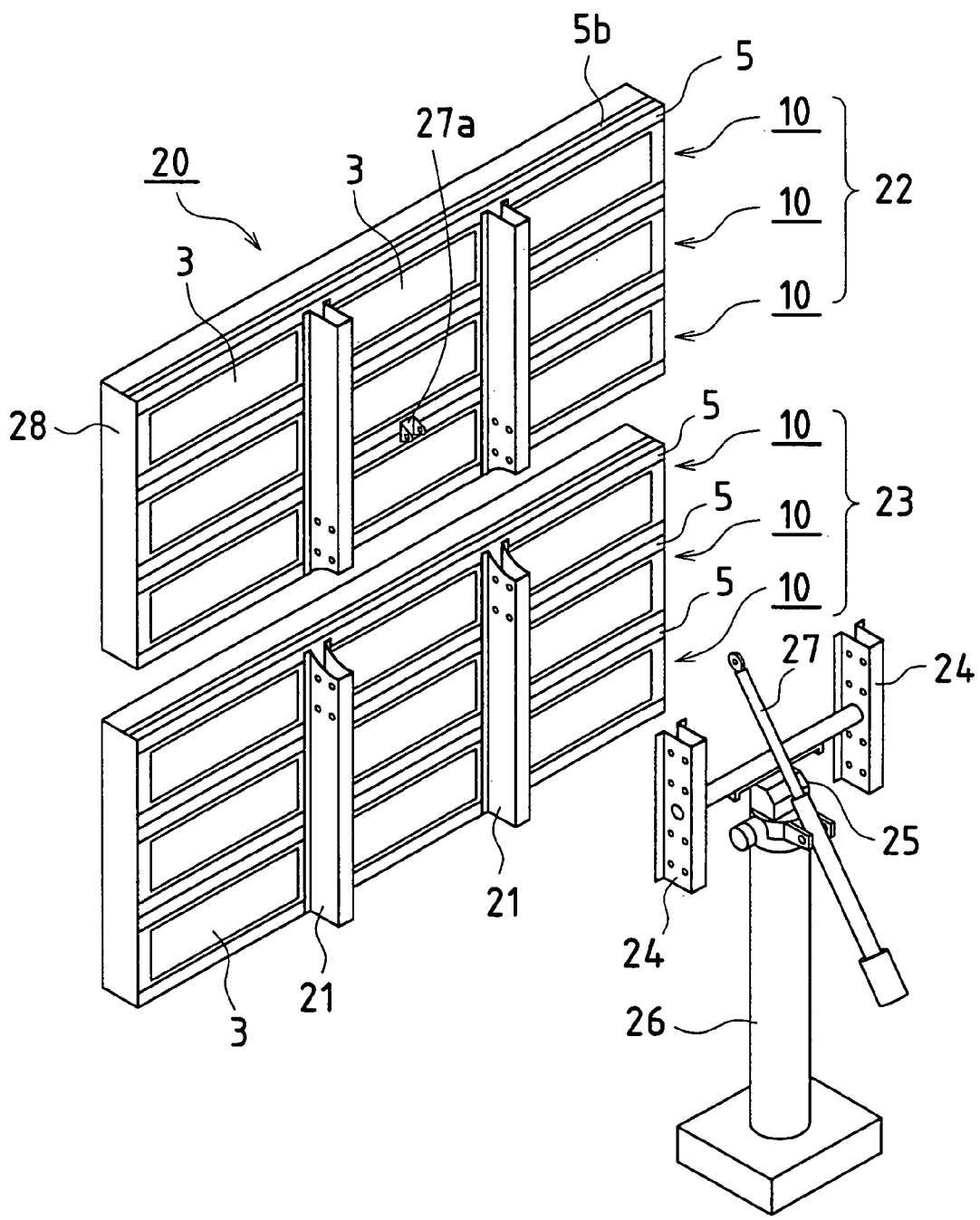
FIG. 9 is an exploded perspective view of the concentrating solar power generation apparatus in FIG. 8, exploded from the rear side of the apparatus.

FIG. 8 is a schematic front view of the concentrating solar power generation apparatus according to Embodiment 2 of the technology described herein, with the light receiving face in a perpendicular state. FIG. 9 is an exploded schematic perspective view of the rear side of the concentrating solar power generation apparatus in FIG. 8.

A concentrating solar power generation apparatus 20 in this embodiment has a plurality of the concentrating solar power generation units 10 according to Embodiment 1 linked in the short-side direction perpendicular to the lengthwise direction of the frames 5. With this constitution, the light receiving plane has better weight balance in the vertical and horizontal directions, which affords a planar shape that is suited to tracking drive.

That is, the mating grooves 5b are mated together to link a group (such as three) of the frames 5 in the short-side direction, and U-shaped main beams 21 are disposed in the short-side direction between the mounting plates 3 that have been divided up and laid out corresponding to a group of frames 5 so as to support and link the mounting plates 3, which configures a power generation module 22 on the upper side in the vertical direction, and a power generation module 23 on the lower side. That is, the total number of concentrating solar power generation units 10 may be six, and the concentrating solar power generation apparatus 20 can be made up of just a few units, so good mechanical strength can be ensured and productivity and mass production can be improved.

Because the lengthwise direction of the frames 5 is disposed in the horizontal direction, the frames 5 can be pressed together over a large surface area (utilizing the total surface of the frames 5), so the linking strength between the frames 5 is higher, mechanical strength is higher, and stable linking is possible. Also, because the frames 5 are supported by the main beams 21, mechanical strength can be further increased.

Also, since the mounting plates 3 are disposed so that they do not overlap the main beams 21, then even after the concentrating solar power generation apparatus 20 has been installed on site, it will be possible to remove the mounting plates 3 from the light shields 4 while the frames 5 are still fixed in place, which makes maintenance, inspection, and repair easier.

In other words, with the concentrating solar power generation apparatus 20, a plurality of the concentrating solar power generation units 10 according to Embodiment 1 are linked, and when the concentrating solar power generation units 10 are linked in the short-side direction that intersects the lengthwise direction of the frames 5, a structurally stable module is constituted, so mechanical strength is higher and a planar shape that is suited to automatic tracking can be achieved, which allows a large power generation capacity to be obtained reliably, with good productivity, ease of work, and high reliability.

Also, with the concentrating solar power generation apparatus 20, when the lengthwise direction of the frames 5 is disposed horizontally, the frames 5 can be linked together securely, which affords higher mechanical strength and stable linking.

Also, with the concentrating solar power generation apparatus 20, when the constitution includes the main beams 21 that link the frames 5 in the short-side direction that intersects the lengthwise direction of the frames 5, the linked frames 5 can be securely supported and linked, which affords a concentrating solar power generation apparatus with higher mechanical strength.

Also, with the concentrating solar power generation apparatus 20, the mounting plates 3 and the translucent substrates 6 can be easily removed from the frames 5 and the light shields 4 with the frames 5 still fixed, even after on-site installation, which means that maintenance, inspection, and repair can be carried out easily on site.

In the installation of the concentrating solar power generation apparatus 20, the power generation modules 22 and 23 can be fixed with even higher mechanical strength by using main beam joining portions 24. The main beam joining portions 24 are suitably supported by a support 26 via a tracking drive portion 25. The tracking drive portion 25 is made up of a rotary drive portion having a function of rotating horizontally, and a tilt drive portion having a function of rotating vertically, so that the sunlight Ls can be automatically tracked. The distal end of a control rod 27, which is equipped with the tilt drive portion, is linked to a fixing piece 27a provided to the back of the power generation module 22, and affords better control and stability.

End face side walls 28 corresponding to the end faces in the lengthwise direction of the frames 5 are constituted by plates that integrally cover a plurality of linked frames 5, and are formed on the power generation modules 22 and 23. Naturally, the end face side walls 28 may be formed divided up corresponding to the concentrating solar power generation units 10.

The end face side walls 28 are preferably in a breathable state in order to prevent the temperature from rising inside the frames 5. Specifically, ventilation holes or a mesh is preferably formed on part of the plate so that ventilation can be ensured while preventing dirt and so forth from getting inside.

It should go without saying that it is possible to have a concentrating solar power generation apparatus that is track driven by the concentrating solar power generation units 10 alone.

EMBODIMENT 3

A concentrating solar power generation units 10 according to this embodiment have the same basic configuration as the concentrating solar power generation units 10 in Embodiment 1, and will be described through reference to the same FIGS. 1, 4, 5, 6, and 7. In these drawings, those portions that are the same are numbered the same.

The concentrating solar power generation unit 10 in this embodiment includes solar cell elements 1, a mounting plate 3 on which are mounted the solar cell elements 1 that are bonded to receivers 2, a light shield 4 that covers the mounting plate 3 and shields the mounting plate 3 from sunlight Ls, frames 5 disposed vertically from the ends on two opposite sides of the light shield 4, concentrating lenses 7 that are disposed corresponding to the upper ends of the frames 5 across from the light shield 4 and that concentrate sunlight Ls on the light receiving region (concentrating region) of the solar cell elements 1, and a translucent substrate 6 that supports and fixes (fastens) the concentrating lenses 7 and is mounted to the upper ends of the frames 5. The translucent substrate 6 and concentrating lenses 7 constitute a concentrating lens structure 8.

Because the number of parts is reduced by constituting them by constituent members corresponding to function, assembly is easier, the product can be smaller and lighter, and the concentrating solar power generation unit 10 has high mechanical strength.

There are, for example, two rows of five (for a total of ten) solar cell elements 1 mounted on the receivers 2 and disposed on the mounting plate 3. The solar cell elements 1 (light receiving regions) are disposed corresponding to the concentration positions (concentrating regions) of the concentrating lenses 7. The mounting plate 3 is formed in a dish shape having a recess that leaves space to hold the solar cell elements 1 and the receivers 2 in a unit of ten each, and a flange 3a is formed around the peripheral edge for attaching to the light shield 4. The mounting plate 3 is formed from aluminum for example, considering lightness, heat radiation etc.

The concentrating lenses 7 are disposed in two rows of five (for a total of ten) on the translucent substrate 6 so as to correspond to each of the ten solar cell elements 1, and are fixed to constitute a lens array. The concentrating lenses 7 are formed from PMMA (acrylic resin) for example, considering workability and translucency, and is a Fresnel lens because of moldability and cost.

Figure 11:
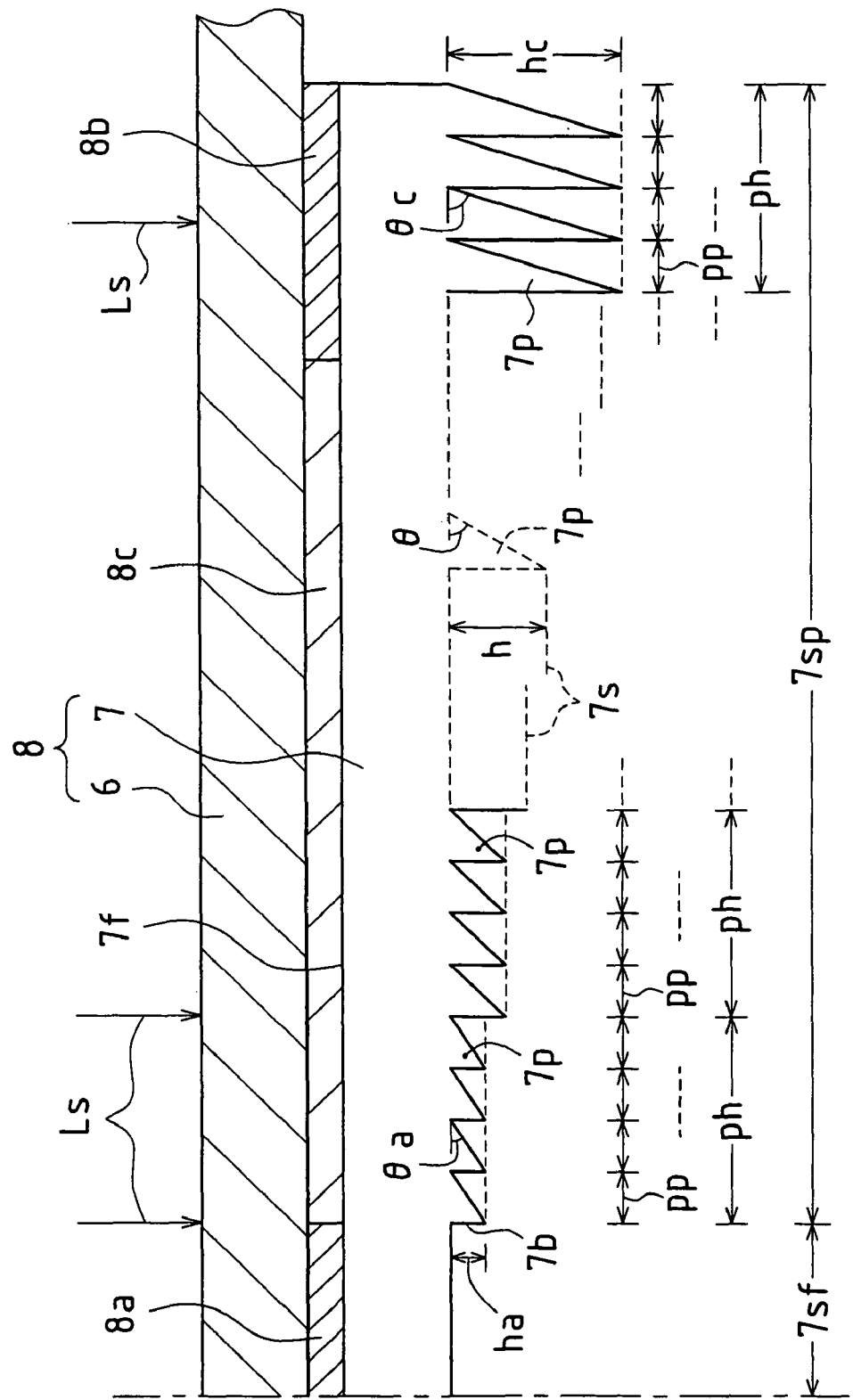
FIG. 11 is an enlarged partial schematic cross-sectional view of the concentrating lens structure in FIG. 10, and shows the partial schematic cross section from the planar center of the concentrating lens structure to arrow A.

The concentrating lenses 7 each have a flat first face 7f that is fixed to the translucent substrate 6, and a second face 7s that is disposed across from the light shield 4 (see FIG. 11). Each second face 7s includes a flat region 7sf having a flat face parallel to the first face 7f, and a protruding region 7sp in which are formed protrusions 7p having an inclined face that is inclined with respect to the first face 7f (see FIG. 11).

The translucent substrate 6 is made from glass for example, considering translucency, strength, resistance to the environment, etc., so as to prevent damage by the weather in the surrounding environment in which the concentrating solar power generation unit 10 is disposed. The concentrating lenses 7 are bonded and fixed (supported) on the translucent substrate 6 by a suitable adhesive agent or the like that is translucent, and constitute the concentrating lens structure 8 (see FIG. 14).

The concentrating lenses 7 are adjusted for optical distance (determined based on the focal distance) so as to concentrate light in the light receiving regions of the solar cell elements 1, and therefore the sunlight Ls concentrated by the concentrating lenses 7 has extremely high energy around the solar cell elements 1. When the configuration allows the sunlight Ls to be tracked, the solar cell elements 1 will not always be able to maintain a facing relationship with respect to the concentrated sunlight Ls, and situations are also envisioned in which the tracking apparatus shuts down due to occurrence of abnormal conditions. That is, there is the risk that the concentrated sunlight Ls will irradiate the surrounding members of the mounting plate 3 rather than the light receiving regions of the solar cell elements 1, in which case there is the risk of burning or other damage to the irradiated portions.

Therefore, the light shield 4 is structured to block the sunlight Ls so as to prevent damage from the concentrated sunlight Ls, and the constitution is such that the sunlight Ls will have no effect outside the light receiving regions of the solar cell elements 1. Also, transmission holes 4a, which transmit the concentrated sunlight Ls and allow it to irradiate the light receiving regions of the solar cell elements 1, are provided and aligned so as to be across from the light receiving regions of the solar cell elements 1, so that light can be received by the solar cell elements 1, in order to enable receiving sunlight by the solar cell elements 1 in addition to the light shielding function of the light shield.

In other words, the transmission holes 4a are made corresponding to each of the ten solar cell elements 1 mounted on the mounting plate 3, and matching up the positions of the solar cell elements 1 and the concentration positions of the concentrating lenses 7 with the positions of the transmission holes 4a is extremely important to ensure good power generation efficiency. Also, the light shield 4 is disposed at the bottoms of the frames 5 such that it is disposed near the mounting plate 3 adjacent to each other, to reliably realize the action of the transmission holes 4a.

To ensure and increase the mechanical strength of the concentrating solar power generation unit 10, and to boost productivity, the light shield 4 and the frames 5 are preferably formed integrally by continuous molding. Therefore, the light shield 4 and the frames 5 are integrally formed, for example, by roll forming sheet metal, such as sheet iron or sheet steel, to constitute a structure 11.

Integrating the light shield 4 with the frames 5 increases productivity because there is no need to use a separate member as the light shield 4. Also, since the position of the light shield 4 (the transmission holes 4a) is demarcated integrally with the frames 5, the alignment of the mounting plate 3 (the solar cell elements 1) and the concentrating lens structure 8 (concentrating lenses 7) can be performed more precisely.

A flange 5a for supporting the concentrating lens structure 8 (translucent substrate 6) is formed integrally during roll forming at each of the upper ends of the frames 5, allowing the concentrating lenses 7 to be positioned more reliably. That is, the mounting plate 3 and the translucent substrate 6 (concentrating lenses 7) can be aligned more precisely by using the structure 11, which is made up of the frames 5 and the light shield 4, as a reference position (basic shape), and light can be concentrated more precisely.

The mounting plate 3 is mounted on the light shield 4, holds ten of the solar cell elements 1 along with the light shield 4, and forms a protective space that protects the solar cell elements 1 from the external environment. A frame bottom 4b that protrudes upward toward the upper ends of the frames 5 in order to mount the mounting plate 3 is integrally formed on the light shield 4 during roll forming. The light shield 4 formed integrally with the frames 5 will sometimes be referred to as the frame bottom 4b for the sake of convenience.

The translucent substrate 6 that fixes the concentrating lenses 7 is mounted at the upper ends (flanges 5a) of the frames 5. Also, because the concentrating lenses 7 is required to be disposed so that the sunlight Ls that passes through the concentrating lenses 7 is concentrated on the light receiving regions of the solar cell elements 1, the height of the frames 5 is set so as to demarcate the necessary optical distance between the solar cell elements 1 and the concentrating lenses 7 (the distance required to generate the maximum power), taking into account the focal distance of the concentrating lenses 7.

In other words, the height of the frames 5 is set so that when the solar cell elements 1 and the sunlight Ls are facing each other, the sunlight Ls incident on the concentrating lenses 7 passes through the transmission holes 4a of the light shield 4 and reliably irradiates the entire light receiving regions of the solar cell elements 1 mounted on the receivers 2. "Facing" here refers to a relationship in which the optical axis directions are aligned.

Mating grooves 5b that allow the frames 5 (of adjacent concentrating solar power generation units (not shown)) to be mated together are integrally formed during roll forming in the lengthwise direction of the frames 5. A concentrating solar power generation apparatus with an even larger power generation capacity can be constituted by mating the mating grooves 5b and linking a plurality of frames 5 in the short-side direction intersecting the lengthwise direction. Because the mating grooves 5b allow the frames 5 to be mated together, the structure 11 can be maintained at high mechanical strength even when a plurality of frames are linked.

The mounting plate 3 and the translucent substrate 6 are mounted such that they are divided into a plurality of parts in the lengthwise direction of the frames 5 (structure 11). With this constitution, even when the frames 5 are lengthened in their lengthwise direction in order to increase the size of the concentrating solar power generation unit 10, assembly will still be easy, which means that productivity is higher, and maintenance, inspection, repair, and so forth can be carried out more easily.

Also, if the mounting plate 3 and the translucent substrate 6 are shortened with respect to the length of the frames 5 (structure 11) in their lengthwise direction, the alignment of the solar cell elements 1 and the concentrating lenses 7 with respect to the frames 5 may be performed over a narrower range (a divided range) with respect to the light shield 4 (the transmission holes 4a) and the frames 5, so alignment can be performed more precisely.

When the mounting plate 3, the frames 5 (structure 11), and the translucent substrate 6 are each made of a different material, each will have a different coefficient of thermal expansion, so the greater the length, the greater the effect of thermal expansion, and there is the risk that positional shift caused by temperature changes will keep the concentrated sunlight Ls from irradiating the solar cell elements 1. However, if the mounting plate 3 and the translucent substrate 6 are divided up to make them shorter, the thermal expansion only has to be taken into account for a shorter length (over a narrower range), so the effect of thermal expansion can be reduced.

The side walls in the short-side direction of the frames 5 are covered by a plate that bridges the opposing frames 5, but are preferably covered in a breathable state in order to prevent the temperature from rising inside the structure 11. Specifically, the side walls in the short-side direction of the frames 5 are covered by a plate in part of which have been formed ventilation holes or a mesh so that ventilation can be ensured while preventing dirt and so forth from getting inside.

FIG. 4 is a schematic see-through side view illustrating the layout relationship of the main portions of the concentrating solar power generation unit according to an embodiment of the technology described herein, as seen from the side in the lengthwise direction. FIG. 5 is an enlarged cross-sectional view of the schematic cross section along the A-A line in FIG. 4.

The structure 11 (the light shield 4 and the frames 5) is formed by using a preform formed by continuous bending by roll forming, and cutting the preform to the proper length for a concentrating solar power generation unit 10, such as to about 3 m in the lengthwise direction.

The mounting plate 3 and the translucent substrate 6, which have been divided into a plurality of parts (say, three) about 1 m in length in the lengthwise direction, are disposed at the rear side of the light shield 4 and the upper ends of the frames 5, respectively, and fixed (mounted). Because the length of the translucent substrate 6 is about 1 m, for example, the concentrating lenses 7 arranged in a row of five in the lengthwise direction measure about 200 mm square. Therefore, the width of the translucent substrate 6 and the light shield 4 in the short-side direction is about 400 mm. The width of the mounting plate 3 is about 300 mm. Because they have been divided into a plurality of parts, the mounting plate 3 and the translucent substrate 6 are affected less by thermal expansion, according to the number of divisions.

The sunlight Ls that is incident from the surface of the translucent substrate 6 and passes through the concentrating lenses 7 is concentrated, passes through the transmission holes 4a of the light shield 4, and irradiates the solar cell elements 1 mounted on the mounting plate 3.

The mounting plate 3 is mounted with the flange 3a butted against the rear side of the light shield 4 (the frame bottom 4b) that is contiguous with the lower ends of the frames 5. The mounting plate 3 is positioned in the center of the flange 3a corresponding to a long side of the mounting plate 3, is securely fixed with suitable fasteners (not shown), and the flange 3a at other positions is suitably latched (loosely fixed) with fasteners. Positional shift caused by thermal expansion can be halved compared to that when positioning is done at the ends, for example, by positioning and fixing in the center. Also, when all four sides of the mounting plate 3 are fixed at the same strength, the effect of warping and so forth caused by thermal expansion is greater, but the occurrence of warping (bending) and so forth can be prevented by securing fixing at the center position and loosely fixing the other positions in a latched state. This allows the effect of thermal expansion to be reduced.

That is, by positioning and fixing at the center of the flange 3a (mounting plate 3) that is approximately 1 m long, the range over which positional shift due to thermal expansion has an effect can be cut in half, or about 0.5 m. In this fixing, two separated fixing points are provided in the center so that the rotation of the mounting plate 3 will not cause any positional shift. Although not shown in the drawings, the same effect will be obtained when the two fixing points are disposed the same as the two substrate border alignment portions 6b, which position the translucent substrate 6 (discussed below) (see FIGS. 15 and 16).

The translucent substrate 6 has its side on which the concentrating lenses 7 are attached facing the light shield 4, and a substrate border 6a is provided between the edge of the attached concentrating lenses 7 and the edge of the translucent substrate 6. Just as with the mounting plate 3, the translucent substrate 6 is positioned and fixed with respect to flange protrusions 5c formed on the flange 5a, by through-holes formed as the substrate border alignment portions 6b in the center corresponding to the long side of the substrate border 6a (see FIGS. 15 and 16). Again with the translucent substrate 6, since the effect regarding thermal expansion is the same as that with the mounting plate 3, positional shift can be suppressed.

The mounting and fixing of the translucent substrate 6 to the flanges 5a can be accomplished by press bonding the substrate border 6a to the flanges 5a using suitable fasteners (not shown) made in a shape that follows the periphery of the translucent substrate 6. In between adjacent translucent substrates 6, they may be fixed by fasteners (not shown) of a shape that spans the two.

Because the positioning and fixing of the mounting plate 3 and the translucent substrate 6 are performed at the same level of precision with respect to a common (the same) structure 11 (the transmission holes 4a of the light shield 4, and the flanges 5a at the upper ends of the frames 5), the positioning precision can be improved for the concentrating solar power generation unit 10 as a whole, allowing the efficiency with which sunlight is utilized to be reliably increased.

When ease of working during molding is taken into account, the concentrating lenses 7 are formed in a size of approximately 200 mm square corresponding to each of the solar cell elements 1, an acrylic resin or the like is injected into a Fresnel lens-shaped mold, and the concentrating lenses 7 are formed as Fresnel lenses that are flat on one side. Using Fresnel lenses allows the concentrating lenses 7 to be thinner even when light is concentrated on the solar cell elements 1 with a small surface area by the concentrating lenses 7 with a large surface area. Reducing thickness also makes the product lighter and less expensive, and facilitates maintenance.

Instead of the concentrating lenses 7 being molded individually for each of the solar cell elements 1, it is also possible for a plurality of Fresnel lenses to be molded integrally so as to correspond to a plurality of solar cell elements 1. Also, since good strength and planarity can be ensured by bonding concentrating lenses 7 of reduced thickness to the translucent substrate 6, it is possible to form a lens shape with good concentration characteristics.

FIG. 6 is a plan view of the layout at the receiver of a solar cell element mounted on the concentrating solar power generation apparatus according to an embodiment of the technology described herein.

With this embodiment, the solar cell element 1 is worked into a chip with a light receiving region measuring 7 mm square from a wafer by forming a PN junction, electrode, etc., by known semiconductor manufacturing processes using a GaAs compound semiconductor. The solar cell element 1 is electrically and mechanically connected and bonded (mounted) by a rear electrode on a copper receiver 2 measuring about 60 mm square. Reference holes 2p are precisely made at diagonally opposite corners of the receiver 2, and the solar cell element 1 is positioned and bonded using these reference holes 2p as a reference.

A bypass diode Di is connected in parallel with the solar cell element 1, and when the solar cell element 1 operates as a resistor by blocking sunlight Ls or the like, a current path is constituted to an adjacent solar cell element 1, and the overall power generation function of the concentrating solar power generation unit 10 can be maintained even if a given solar cell element 1 should fail to perform its power generation function.

The surface of the receiver 2 is exposed in a region of a substrate electrode connection part 2b, and a region where the substrate electrode of the bypass diode Di is connected to the substrate electrode of the solar cell element that needs electrical connection, and the rest of the surface region is covered by an insulating resist 2i. A surface electrode connection portion 2t, which is an electrode for output takeoff, is formed from a suitable thin conductor sheet on part of the surface of the insulating resist 2i.

Surface electrodes formed on the two facing chip ends of the solar cell element 1 are wire bonded to the surface electrode connection portion 2t via a wire Ws, allowing output to be taken off between the surface electrodes 1a and the substrate electrode connection portion 2b. Also, the surface electrode of the bypass diode Di is wire bonded to the surface electrode connection portion 2t via a wire Wd, allowing bypass operation to be performed.

Conductive leads 2c are connected to the surface electrode connection portion 2t and the substrate electrode connection portion 2b to allow connection to adjacent solar cell elements 1, and large-capacity power generation is possible by using the conductive leads 2c to connect the solar cell elements 1 in series or parallel.

FIG. 7 is an explanatory diagram illustrating the layout of the transmission hole and the mounting state of the solar cell element mounted on the concentrating solar power generation unit according to an embodiment of the technology described herein, with FIG. 7(A) being a side see-through view, and FIG. 7(B) a plan view of the light shield (transmission hole) from the concentrating lens side.

The bypass diode Di and the solar cell element 1 soldered to the exposed surface of the receiver 2 are surrounded (in plan view) by a sealing dam 2sd and sealed with a sealing resin 2sr. Sealing glass 2sg is disposed on the surface of the sealing resin 2sr to improve the moisture resistance of the sealing resin 2sr (on the surface on the frame bottom 4b side). The sealing dam 2sd is formed from a while silicone resin, for example, while the sealing resin 2sr is formed from a silicone resin with high translucence, for example.

Because receiver 2 is made of copper, it functions as a heat dispersal means with respect to the solar cell element 1, which is at extremely high temperature when it is irradiated with the concentrated sunlight Ls. The receiver 2 on which the solar cell element 1 is mounted is bonded via an insulating thermally conductive sheet 3i on the aluminum mounting plate 3, and maintains a state of electrical insulation while dispersing the heat from the solar cell element 1 to the outside atmosphere from the mounting plate 3.

The positioning and fixing between the receivers 2 and the mounting plate 3 can be performed precisely by forming receiving holes 3p in the mounting plate 3 that are accurately aligned with respect to the reference holes 2p provided to the receivers 2, inserting rivets 2r having an insulating coating in the reference holes 2p and the receiving holes 3p, and fixing these rivets.

The transmission holes 4a are preferably openings with a shape and size such that the sunlight Ls incident as a parallel light beam on the concentrating lenses 7 irradiates a range in which sunlight Lsa of the short wavelength band of the light of a wavelength to which the solar cell elements 1 are sensitive produced by refraction by the concentrating lenses 7 reaches the far edge of the solar cell elements 1, while sunlight Lsb of the long wavelength band of the light of a wavelength to which the solar cell elements 1 are sensitive reaches the near edge of the solar cell elements 1. Openings are provided in which the length b is 13 mm on all four sides, with respect to a solar cell element 1 having a (7 mm)$^2$ light receiving region and a concentrating lens 7 having a focal distance (the distance at which light is concentrated in planar form on the light receiving region of the solar cell element 1; the optical distance) of 300 mm. It should go without saying that the gap between the frame bottom 4b and the mounting plate 3 is suitably adjusted.

The transmission holes 4a can be punched out in a shape and size of b=13 mm on all four sides, but it is preferable to form a bent portion 4c in which the edge around a transmission hole 4a is drawn and bent to the mounting plate 3 side, and impart the function (angle) of blocking the sunlight (Lsd)

that could possibly pass through at an angle and irradiate a portion other than the solar cell element 1.

Furthermore, the sunlight Ls that irradiates the bent portion 4c can be reflected to the solar cell element 1 side and the incidence efficiency raised by giving a mirror finish to a surface (incident-side surface) 4s on the concentrating lens 7 side of the bent portion 4c.

Figure 10:
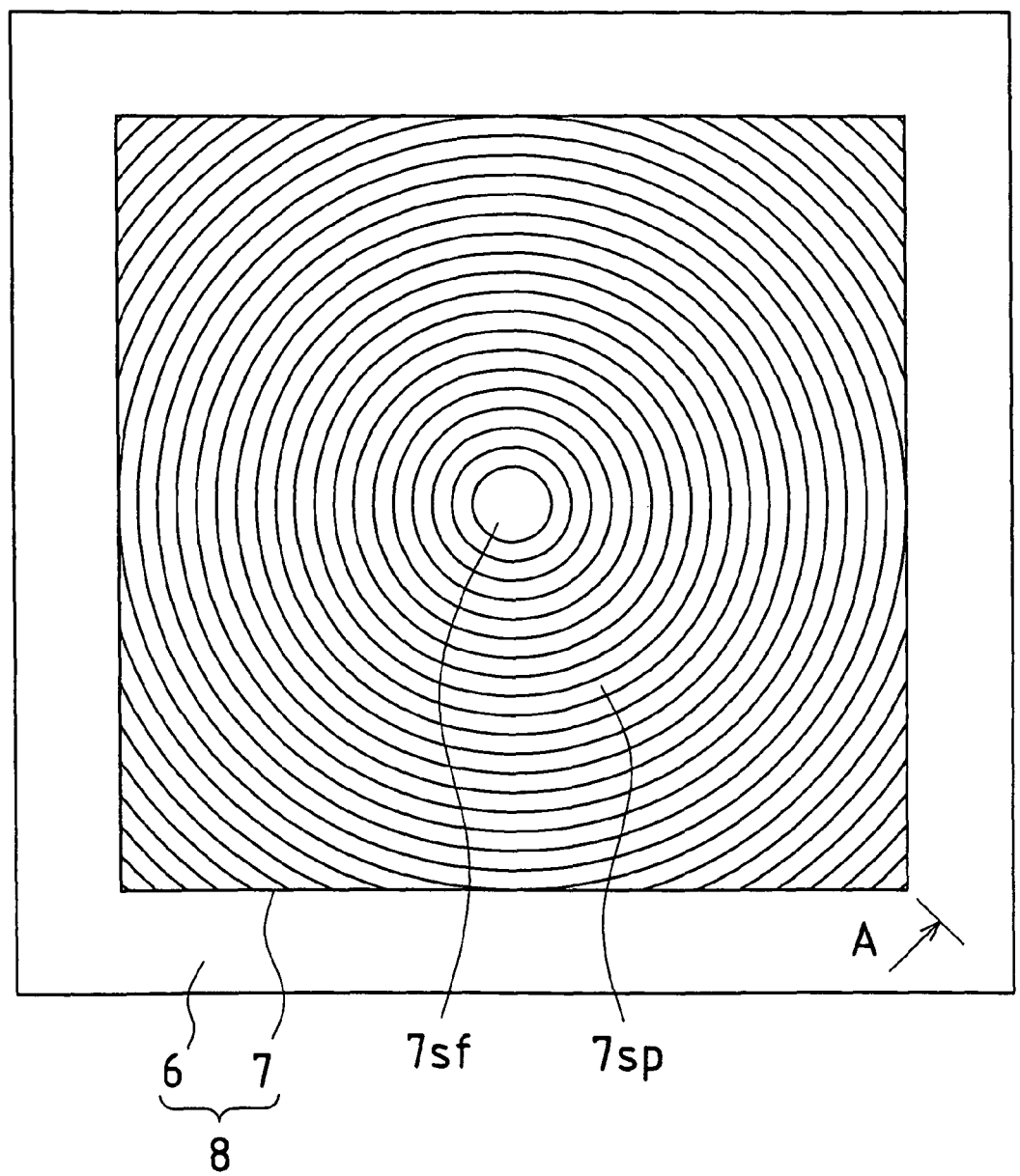
FIG. 10 is a plan view of the concentrating lens structure according to Embodiment 3 of the technology described herein.

FIG. 10 is a plan view of the concentrating lens structure according to an embodiment of the technology described herein. FIG. 11 is an enlarged schematic cross-sectional view of the concentrating lens structure in FIG. 10, and shows the partial schematic cross section from the planar center of the concentrating lens structure to arrow A. To make it easier to see in the drawing, this illustrates a state in which just one concentrating lens 7 has been fixed on the translucent substrate 6 (hatching has been removed to make the drawing easier to view). Also, in FIG. 11 the vertical direction in the drawing has been suitably expanded.

The flat first faces 7f of the concentrating lenses 7 are fixed to the translucent substrate 6 to constitute the concentrating lens structure 8. The concentrating lenses 7 have the first face 7f and the second face 7s that is across from the first face. A plurality of protrusions 7p having an inclined face that is inclined with respect to the first face 7f are formed on the second face 7s in concentric circles and at a pitch pp, forming a Fresnel lens capable of concentrating light in a concentrating region (light receiving region) (not shown).

When ease of working during molding is taken into account, the protrusions 7p have a pitch pp of 0.5 mm and a triangular wave shape formed by an inclined face and a vertical face (the protrusion height is h, and the angle of inclination to the first face 7f (the flat region 7sf) is θ). Because the protrusions 7p made up of inclined faces and vertical faces are formed as concentric circles, when resin is injected into a mold and cured to form a Fresnel lens, the molded article can be easily parted from the mold without imparting any stress, and a precise Fresnel lens can be obtained.

The second face 7s includes a flat region 7sf having a flat face parallel to the first face 7f, and a protruding region 7sp having protrusions 7p. The boundary 7b between the flat region 7sf and the protruding region 7 sp is demarcated by the step between the flat region 7sf and the protrusions 7p, and the step is demarcated by the flat face of the flat region 7sf and the vertical faces of the protrusions 7p. Using (the step of) the boundary 7b makes it possible to align the flat region 7sf precisely with the concentrating region (see FIGS. 12 to 14).

Between the translucent substrate 6 and the concentrating lens 7 (first face 7f), a flat region fixing portion 8a for fixing the translucent substrate 6 and the concentrating lens 7 corresponding to the flat region 7sf is formed, allowing the position of the flat region 7sf to be fixed more reliably. Similarly, a peripheral edge fixing portion 8b for fixing the translucent substrate 6 and the concentrating lens 7 is formed corresponding to the peripheral edge of the protruding region 7sp, allowing the concentrating lens 7 with a large surface area to be reliably fixed to the translucent substrate 6. The air layer between the translucent substrate 6 and the concentrating lens 7 is removed and filled with a filled portion 8c.

The protruding region 7sp has four continuous protrusions 7p formed at the same inclination angle θ. The constitution is such that four continuous protrusions 7p have the same inclination angle θ, and the inclination change pitch ph, which is the pitch at which the inclination angle θ changes, is 2 mm. That is, light of each wavelength in the sunlight Ls is similarly refracted at a width of 2 mm corresponding to the inclination change pitch ph.

For example, in the case of a (200 mm)² concentrating lens 7, the protrusions 7p at the end in a square cross section have an inclination angle θc of 36 degrees with respect to the first face 7f, and have a protrusion height θc of about 0.4 mm (since the protrusion height hc is located at the outermost periphery of the concentric circles, this is the tallest protrusion 7p). The inclination angle θ of the four protrusions 7p at the outermost periphery in the direction perpendicular to a side passing through the center of the concentric circles is 29.73 degrees, and the inclination angle θ of the four protrusions 7p to the inside thereof is 29 degrees (not shown). The inclination angle θa of the four protrusions 7p adjacent to the flat region 7sf is 4.71 degrees, and the protrusion height ha is about 0.1 mm.

Thus, the thickness of the protrusions 7p (protrusion height h) decreases from the lens edge toward the lens center. Also, because the flat region 7sf at the lens center is demarcated by a circle having a diameter that can enclose the (7 mm)² light receiving region of the solar cell element 1, this region has a diameter of 10 mm. When the concentrating lens structure 8 is facing the sunlight Ls, the sunlight Ls incident perpendicularly on the flat region 7sf has no chromatic aberration caused by the concentrating lens, and is instead incident in unchanged form on the light receiving region of the solar cell element 1, and there is less variance in the optical intensity distribution, so power generation efficiency can be increased.

With this embodiment, because the solar cell elements 1 are a triple junction type, a photo-electromotive force is produced with respect to light of a broad wavelength band corresponding to various junctions in the depth direction of the chip (ultraviolet to blue to green to red to infrared). The short-circuit current of the solar cell elements 1 according to this embodiment is limited by the short-circuit current of a cell (one element laminated in three layers constituting a solar cell element 1) having a light reception sensitivity in the short wavelength band of the light of a wavelength to which the solar cell elements are sensitive when standard sunlight radiation (AM 1.5) is received. Therefore, when light of the above-mentioned short wavelength band is concentrated more favorably than light of other wavelength bands, the output of the solar cell elements 1 increases. Because the refraction direction of the concentrating lenses 7 varies with the wavelength of the light, the inclination angle θ of the protrusions 7p is determined so that ultraviolet rays with a wavelength of 400 nm will be concentrated (refracted) toward the end of the solar cell elements 1 (light receiving regions), which is a position diagonally opposite (away from) the concentrating lenses 7 (protrusions 7p), in order for the solar cell elements 1 to receive more efficiently the wavelengths of the short wavelength band (ultraviolet to red) of the light of a wavelength to which the solar cell elements 1 are sensitive.

Also, four protrusions 7p (with a width of 2 mm) are formed at the same inclination angle θ, but if too many of the protrusions 7p are lined up with the same inclination angle θ, a greater proportion of the light of the above-mentioned short wavelength band will spread outside the solar cell elements 1 (light receiving regions), so it is effective to keep the width to about 2 mm (inclination change pitch ph) for solar cell elements 1 having a light receiving region of 7 mm square. This configuration lessens focusing, makes it possible to receive light more uniformly over the entire light receiving region, and allows power generation efficiency to be further increased.

That is, the inclination angle θ of the protrusions 7p and the inclination change pitch ph, which is the pitch at which the inclination angle θ changes, are set so that light of the short wavelength band (in other words, light of a wavelength band for which the short-circuit current of the solar cell elements 1 is limited and decided more dominantly than with light of other wavelength bands) will be effectively refracted (concentrated) toward the light receiving regions. Therefore, light of the short wavelength band is concentrated more efficiently, and opto-electric conversion efficiency (power generation efficiency) can be increased.

In this working example, the optical design is such that light of the short wavelength band, which contributes greatly to output current, is efficiently concentrated in the light receiving regions, and at least a specific proportion of the light of other wavelengths will be concentrated in the light receiving regions, which makes it possible to generate power more efficiently overall. This working example is an example of the characteristics of a solar cell element, and wavelengths that contribute greatly to output current are preferably concentrated preferentially.

Figure 12:
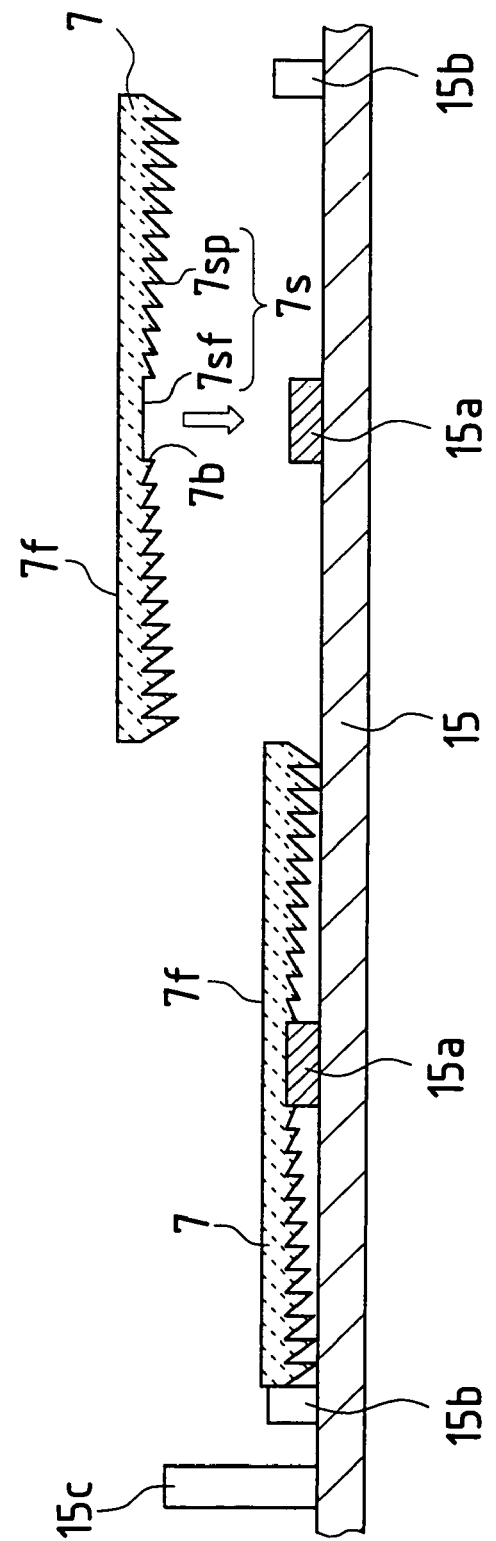
FIG. 12 is a cross-sectional view illustrating the method for manufacturing (manufacturing process) the concentrating lens structure according to Embodiment 3 of the technology described herein.
Figure 13:
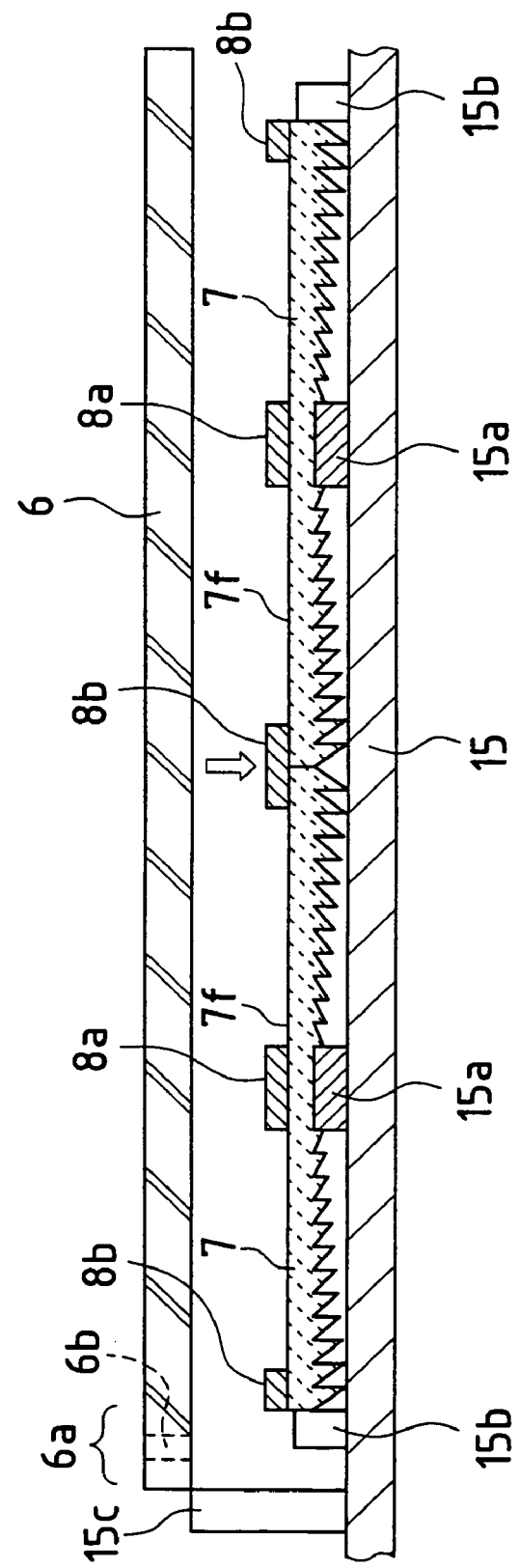
FIG. 13 is a cross-sectional view illustrating the method for manufacturing (manufacturing process) the concentrating lens structure according to Embodiment 3 of the technology described herein.
Figure 14:
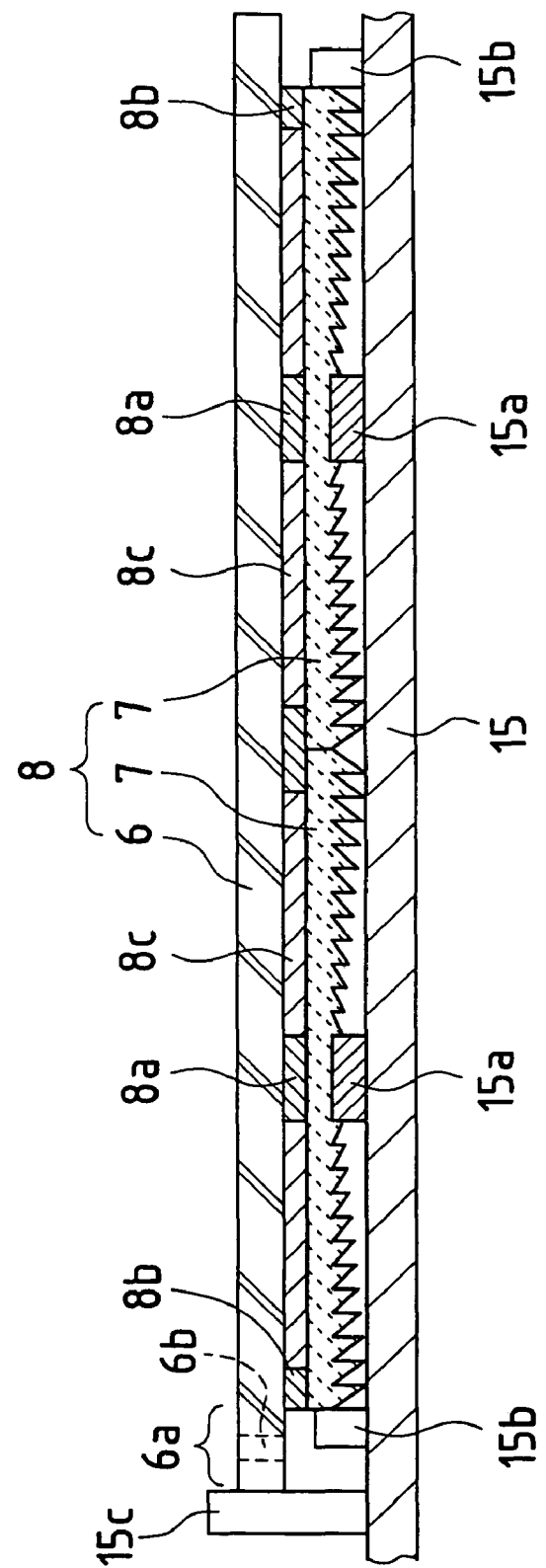
FIG. 14 is a cross-sectional view illustrating the method for manufacturing (manufacturing process) the concentrating lens structure according to Embodiment 3 of the technology described herein.

FIGS. 12 to 14 are cross-sectional views illustrating a method for manufacturing (manufacturing process) the concentrating lens structure according to an embodiment of the technology described herein.

On a positioning jig base 15 flat positioning pieces 15a for determining the position of the flat region 7sf (concentrating lens 7) to be disposed corresponding to the position of the solar cell elements 1 (light receiving regions) are formed. The positioning jig base 15 is formed with an aluminum substrate, for example, and the flat positioning pieces 15a include, for example, a pin having a diameter that inscribes the diameter of the flat region 7sf (a step portion, namely, the vertical face of a protrusion 7p adjacent to the flat region 7sf), and erected on the aluminum substrate. The positioning jig base 15 is further provided with lens anti-rotation pieces 15b that prevent the rotation of the concentrating lenses 7 so that the concentrating lenses 7 can be arranged more neatly next to each other. The lens anti-rotation pieces 15b each includes a pin disposed erect, just as do the flat positioning pieces 15a.

The concentrating lenses 7 (flat regions 7sf) can be positioned more precisely by using the boundary 7b to mate the flat regions 7sf of the concentrating lenses 7 with the flat positioning pieces 15a. FIG. 12 shows a case of lining up two concentrating lenses 7 next to each other; the left side in FIG. 12 shows the state of completed positioning, while the right side shows the state prior to positioning.

The height of the flat positioning pieces 15a is preferably equal to the height hc (0.4 mm) of the outermost protrusion, in order to increase the flatness of the concentrating lenses 7. The distal ends of the flat positioning pieces 15a are mated with the boundary 7b, that is, the step between the flat region 7sf and the adjacent protrusion 7p (the protrusion height ha (0.1 mm) demarcated by the flat face of the flat region 7sf and the vertical face of the protrusion 7p). Because the step between the flat region 7sf and the protrusion 7p is constituted by a vertical face, no shifting in the horizontal direction occurs during positioning, so positioning can be performed more precisely.

On the positioning jig base 15 are also formed substrate edge positioning pieces 15c that determine the positions of the edges of the translucent substrate 6 corresponding to the positions of the flat regions 7sf. The substrate edge positioning pieces 15c include pins erected on the aluminum substrate, for example.

After the concentrating lens 7 on the right side in FIG. 12 has been moved in the direction of the arrow and aligned, flat region fixing portions 8a are formed corresponding to the flat regions 7sf on the first faces 7f of the concentrating lenses 7, and peripheral edge fixing portions 8b are formed corresponding to the peripheral edge of the protruding regions 7sp (see FIG. 13). Either the flat region fixing portions 8a or the peripheral edge fixing portions 8b may be formed first, or they may be formed at the same time. The flat region fixing portions 8a and peripheral edge fixing portions 8b can be formed easily by using a double-sided translucent adhesive tape, for example, and this facilitates the work.

After the flat region fixing portions 8a and peripheral edge fixing portions 8b have been formed, the translucent substrate 6 is moved in the direction of the arrow in FIG. 13 and joined (tacked) to the concentrating lenses 7. Here, the translucent substrate 6 can be aligned precisely by butting the edges of the translucent substrate 6 against the substrate edge positioning pieces 15c.

The result of aligning the translucent substrate 6 is that the concentrating lenses 7 are aligned with the translucent substrate 6 in a state in which the centers of the light receiving regions (solar cell elements 1) are precisely aligned with the flat regions 7sf (concentrating lenses 7). Therefore, the substrate border alignment portions 6b, which are provided to the substrate border 6a of the translucent substrate 6, can be precisely aligned between the edges of the concentrating lenses 7 and the edges of the translucent substrate 6.

After the concentrating lenses 7 and the translucent substrate 6 have been joined via the flat region fixing portions 8a and the peripheral edge fixing portions 8b, the air is purged from the air layer between the concentrating lenses 7 and the translucent substrate 6, this space is then filled with an adhesive agent with high fluidity and translucence, and the adhesive is cured at normal temperature or by baking to form the filled portion 8c (see FIG. 14). The concentrating lenses 7 and the translucent substrate 6 are fixed to each other over their entire surface by the filled portion 8c, which affords a concentrating lens structure 8 with high mechanical strength and the desired optical characteristics. The adhesive agent is preferably one that is translucent and weatherproof, such as an adhesive based on an acrylic resin containing methyl methacrylate and an acrylic monomer, or a silicone resin adhesive.

Because the air layer is removed in the filled portion 8c, there is less difference in the refractive index between the face of the translucent substrate 6 across from the concentrating lenses 7 and the first faces 7f of the concentrating lenses 7 so the reflection loss can be reduced.

Figure 15:
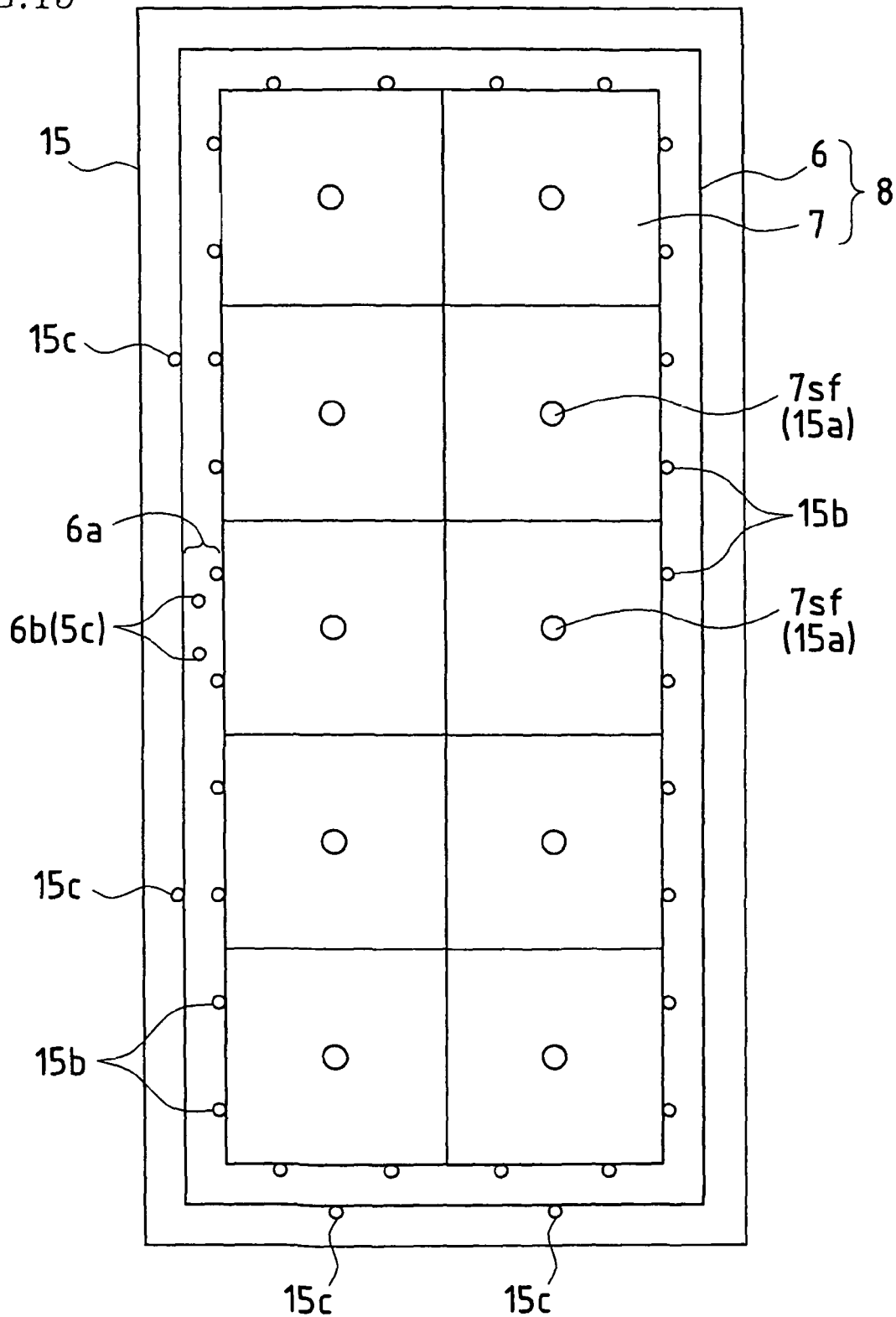
FIG. 15 is a plan view of the concentrating lens structure aligned with the use of a positioning jig base according to Embodiment 3 of the technology described herein.

FIG. 15 is a plan view of a situation in which the concentrating lens structure according to an embodiment of the technology described herein is aligned with the use of a positioning jig base.

The flat regions 7sf of the concentrating lenses 7 are aligned and mated with the flat positioning pieces 15a disposed on the positioning jig base 15. Because the flat regions 7sf are circular, the lens anti-rotation pieces 15b are disposed at suitable locations touching the edges of the concentrating lenses 7 so that the concentrating lenses will not rotate around the flat positioning pieces 15a after alignment. The lens anti-rotation pieces 15b reliably prevent rotation if two of them are provided for every flat positioning piece 15a. A total of ten of the flat positioning pieces 15a are disposed corresponding to the solar cell elements 1 mounted on the mounting plate 3 (the transmission holes 4a in the frame bottom 4b), allowing a lens array to be configured having a total of ten concentrating lenses 7.

The translucent substrate 6 is superposed over the positioned concentrating lenses 7 (lens array), and the translucent substrate 6 and the concentrating lenses 7 are joined to constitute the concentrating lens structure 8. The edges of the translucent substrate 6 are butted against the substrate edge positioning pieces 15c for positioning, and the substrate border alignment portions 6b are formed on the substrate border 6a, positioned at specific locations from the edge. Therefore, the substrate border alignment portions 6b can be positioned with respect to the flat regions 7sf (flat positioning pieces 15a).

The substrate border alignment portions 6b are formed at two locations in the center of the lengthwise direction of the translucent substrate 6 (substrate border 6a), and are positioned and fixed to the flange protrusions 5c (see FIG. 16) formed on the flanges 5a at the upper ends of the frame 5 corresponding to the substrate border alignment portions 6b, which allows for precise positioning with respect to the solar cell elements 1 (the transmission holes 4a), and just as with the mounting plate 3, makes it possible to reduce the effect of positional shift caused by thermal expansion to half (approximately 0.5 m) the length (approximately 1 m) of the translucent substrate 6 in its lengthwise direction.

Figure 16:
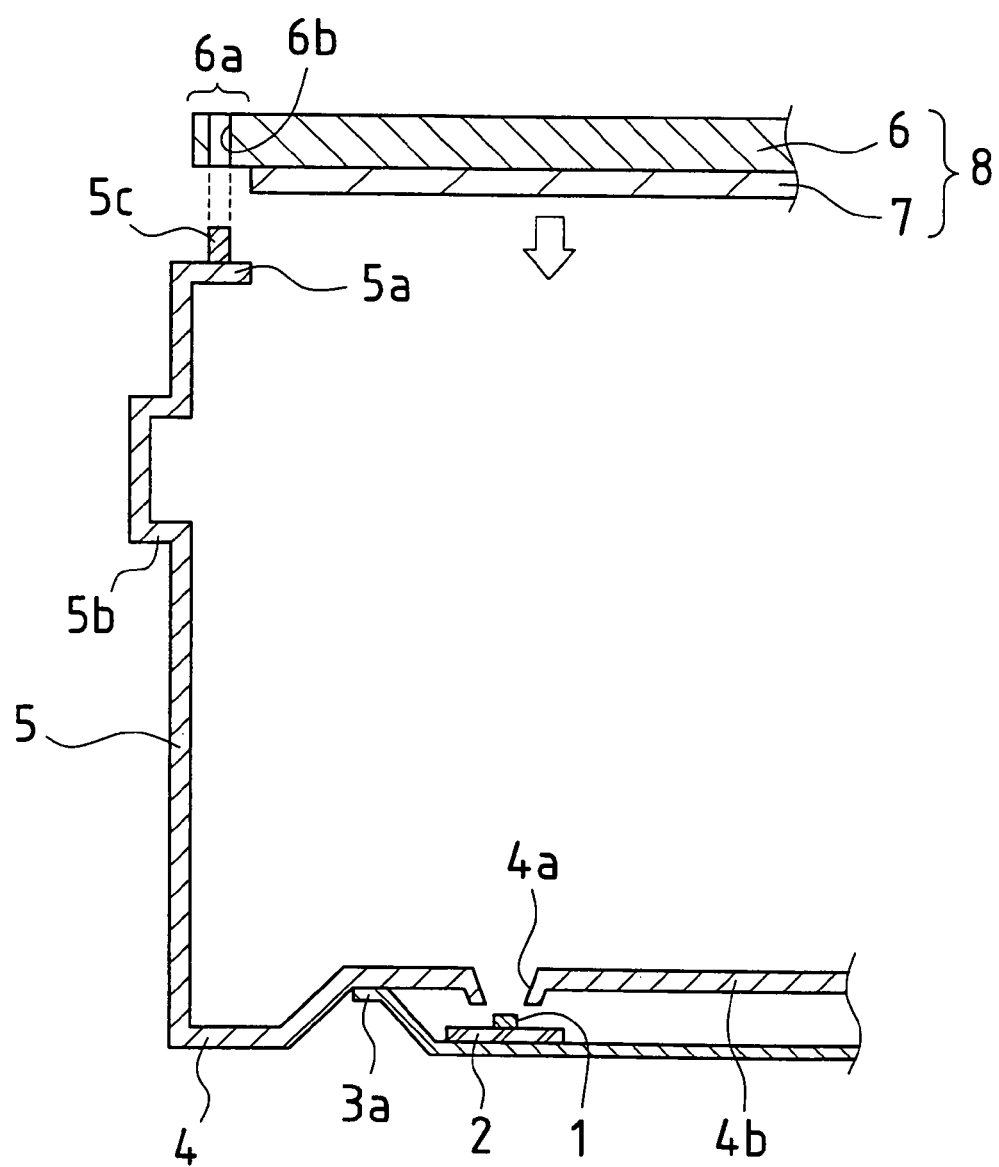
FIG. 16 is a partial cross-sectional view illustrating the state of aligning the concentrating lens structure according to Embodiment 3 of the technology described herein with the solar cell element (frame)
Figure 17:
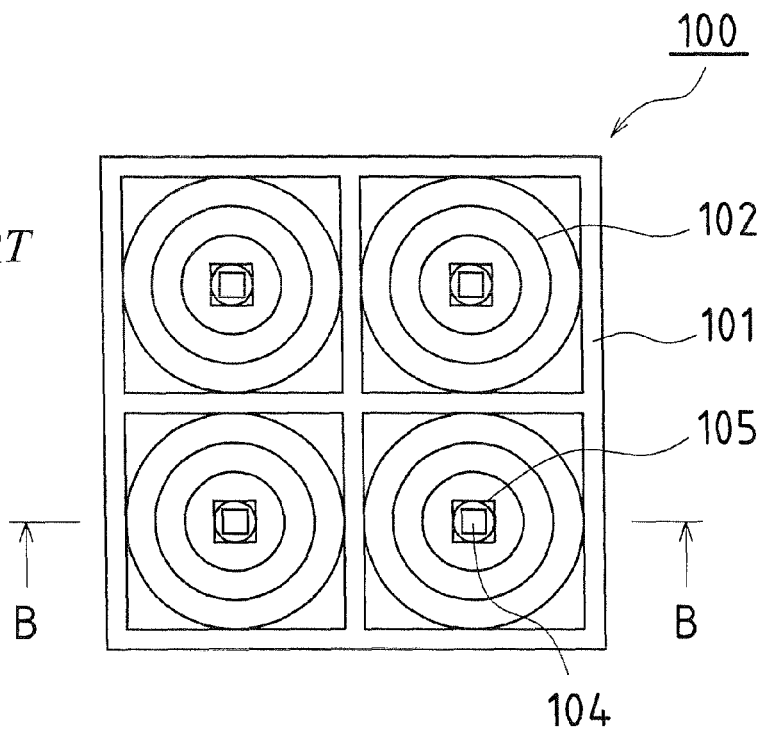
FIG. 17 is an explanatory diagram illustrating a conventional concentrating solar power generation apparatus, with FIG. 17(A) being a schematic plan view from the surface on which sunlight is incident, and FIG. 17(B) a cross-sectional view of the cross section along the B-B line in FIG. 17(A).
Figure 17:
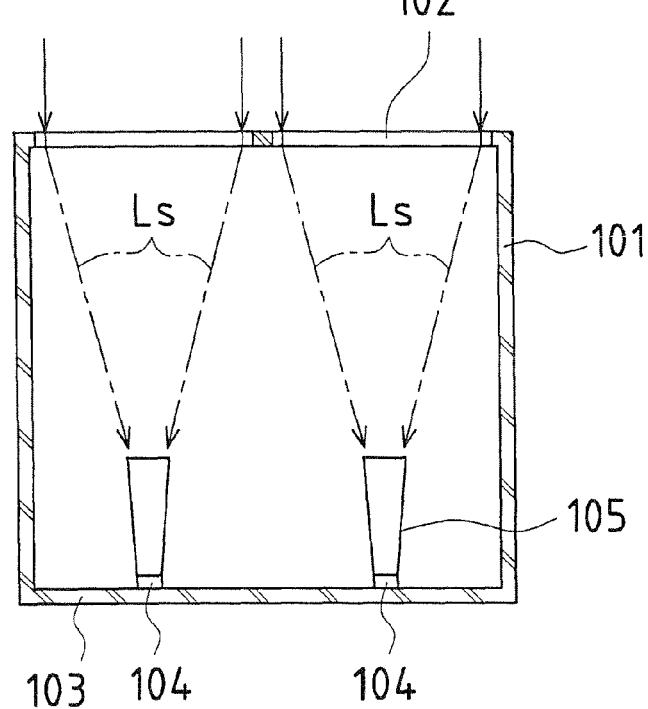

FIG. 16 is a partial cross-sectional view of the state of aligning the concentrating lens structure according to an embodiment of the technology described herein with the solar cell element (on the frame side).

The flange protrusions 5c are formed on the flanges 5a at the upper ends of the frame 5 corresponding to the center of the translucent substrate 6 (substrate border 6a) in its lengthwise direction. The flange protrusions 5c are formed corresponding to the positions of through-holes formed as the substrate border alignment portions 6b in the substrate border 6a so that the concentrating lenses 7 will be aligned with respect to the solar cell elements 1 (transmission holes 4a).

Therefore, if the translucent substrate 6 is moved in the direction of the arrow and the substrate border alignment portions 6b are mated with the flange protrusions 5c, alignment and positioning can be accomplished. After this, the flanges 5a and the translucent substrate 6 are fixed with suitable fasteners (now shown). The shape of the flange protrusions 5c and the substrate border alignment portions 6b is not limited to the examples given above, and it should go without saying that other shapes may also be used. For instance, when the substrate border alignment portions 6b are through-holes, through-holes may similarly be formed in the flanges 5a, and bolts or other fasteners may be passed through the two through-holes and tightened to fix the portions.

The concentrating lens structure 8 according to this embodiment can also be applied to the concentrating solar power generation unit 10 according to Embodiment 1.

The technology described herein can be worked in various other forms without departing from the essence or main features thereof. Accordingly, the working examples given above are in all respects nothing but examples, and should not be interpreted to be limiting in nature. The scope of the technology described herein is given by the claims, and is in no way restricted by the content of this specification. Also, all modifications or changes that come within the meaning and range of equivalency of the claims are intended to be embraced therein.

It should be noted that this application claims priority on Patent Application No. 2005-167526 filed in Japan on Jun. 7, 2005 and Patent Application No. 2005-167527 filed in Japan on Jun. 7, 2005, the entire contents of which are hereby incorporated by reference. Furthermore, documents cited in this specification are hereby specifically incorporated in their entirety by reference.

Industrial Applicability

The technology described herein can be applied to a concentrating solar power generation unit capable of increasing power generation capacity by using a concentrating lens to concentrate sunlight, and to concentrating solar power generation apparatus equipped with this concentrating solar power generation unit, as well as to a concentrating lens, a concentrating lens structure, a concentrating solar power generation unit that makes use of a concentrating lens, and a method for manufacturing a concentrating lens structure.

The invention claimed is:

1. A concentrating solar power generation unit that generates electricity by irradiating a solar cell element with sunlight that has been concentrated with a concentrating lens, comprising:
a mounting plate on which the solar cell element is mounted;
a light shield comprising a transmission hole for irradiating a light receiving region of the solar cell element with sunlight and which covers the mounting plate;
a concentrating lens disposed across from the light shield and configured to concentrate sunlight on the light receiving region by refracting the sunlight; and
a frame configured to align and support the solar cell element and the concentrating lens;
wherein each of the light shield and the frame form a unitary monolithic piece of sheet metal; and
wherein in a position aligned with the transmission hole, the mounting plate is formed in a dish shape having a recess in which the solar cell element is placed.

2. The concentrating solar power generation unit according to claim 1, wherein the light shield has a bent portion in which the peripheral edge of the transmission hole is bent to the mounting plate side.

3. The concentrating solar power generation unit according to claim 1, wherein the middle of an end side of the mounting plate is fixed to the light shield, and the middle of an end side of the concentrating lens is fixed to the upper end of the frame.

4. The concentrating solar power generation unit according to any of claims 1 to 2, wherein a plurality of the solar cell elements are disposed on the mounting plate.

5. The concentrating solar power generation unit according to claim 4, wherein the concentrating lens is disposed and supported on a translucent substrate corresponding to each of the plurality of solar cell elements.

6. The concentrating solar power generation unit according to claim 4, wherein the middle of an end side of the mounting plate in the lengthwise direction is fixed to the light shield.

7. The concentrating solar power generation unit according to claim 5, wherein the middle of an end side of the translucent substrate in the lengthwise direction is fixed to the upper end of the frame.

8. The concentrating solar power generation unit according to claim 5, wherein the mounting plate and the translucent substrate are divided into a plurality of parts in the lengthwise direction of the frame.

* * * * *